(12) United States Patent
Hosokawa et al.

(10) Patent No.: US 9,258,866 B2
(45) Date of Patent: Feb. 9, 2016

(54) LIGHT-EMITTING DEVICE, ELECTRONIC EQUIPMENT, AND METHOD FOR PRODUCING LIGHT-EMITTING DEVICE

(71) Applicant: Idemitsu Kosan Co., Ltd., Tokyo (JP)

(72) Inventors: Chishio Hosokawa, Sodegaura (JP); Yoshikazu Tanaka, Sodegaura (JP); Kazuki Nishimura, Sodegaura (JP)

(73) Assignee: IDEMITSU KOSAN CO., LTD., Tokyo (JP)

( * ) Notice: Subject to any disclaimer, the term of this patent is extended or adjusted under 35 U.S.C. 154(b) by 0 days.

(21) Appl. No.: 14/421,807

(22) PCT Filed: Aug. 16, 2013

(86) PCT No.: PCT/JP2013/071997
§ 371 (c)(1),
(2) Date: Feb. 13, 2015

(87) PCT Pub. No.: WO2014/027688
PCT Pub. Date: Feb. 20, 2014

(65) Prior Publication Data
US 2015/0208480 A1    Jul. 23, 2015

(30) Foreign Application Priority Data
Aug. 17, 2012 (JP) ................................ 2012-181230

(51) Int. Cl.
| | |
|---|---|
| H01L 33/60 | (2010.01) |
| H05B 33/08 | (2006.01) |
| H01L 27/32 | (2006.01) |
| H01L 33/08 | (2010.01) |
| H01L 27/15 | (2006.01) |

(52) U.S. Cl.
CPC ........ *H05B 33/0857* (2013.01); *H01L 27/3206* (2013.01); *H01L 27/3209* (2013.01);
(Continued)

(58) Field of Classification Search
USPC ...................... 257/86, 98–103; 313/490–512; 345/204, 206, 211–214, 102, 76, 82, 345/84, 83; 315/169.1–169.4
See application file for complete search history.

(56) References Cited

U.S. PATENT DOCUMENTS

| | | | |
|---|---|---|---|
| 2008/0061678 A1* | 3/2008 | Hamano | H01L 27/3269 313/498 |
| 2008/0231177 A1* | 9/2008 | Nomura | C09K 11/06 313/504 |

(Continued)

FOREIGN PATENT DOCUMENTS

| | | |
|---|---|---|
| JP | 2006-324016 A | 11/2006 |
| JP | 2009-524189 A | 6/2009 |

(Continued)

OTHER PUBLICATIONS

International Search Report dated Nov. 12, 2013 issued in Application No. PCT/JP2013/071997.

*Primary Examiner* — Tuyet Vo
(74) *Attorney, Agent, or Firm* — Foley & Lardner LLP

(57) ABSTRACT

A light-emitting apparatus includes a first light-emitting device, a second light-emitting device, and a device driving portion having drive transistors. The first light-emitting device includes a first electrode, first light-emitting unit, second electrode, second light-emitting unit, and third electrode. The second light-emitting device includes a third light-emitting unit, fourth electrode, fourth light-emitting unit, and fifth electrode. The light-emitting units are formed in the same step and each have a light-emitting layer that emits a first color light. The second electrode and the fourth electrode are formed in the same step. The light-emitting units are formed in the same step and each have a light-emitting layer that emits a second color light. A first drive transistor is electrically connected to the first electrode while a second drive transistor is electrically connected to the fourth electrode.

16 Claims, 19 Drawing Sheets

(52) U.S. Cl.
CPC ............ *H01L27/3244* (2013.01); *H01L 33/08* (2013.01); *H05B 33/0896* (2013.01); *H01L 27/153* (2013.01); *H01L 27/3211* (2013.01); *H01L 2933/0016* (2013.01)

(56) References Cited

U.S. PATENT DOCUMENTS

| | | |
|---|---|---|
| 2009/0009101 A1 | 1/2009 | Kang et al. |
| 2011/0266572 A1 | 11/2011 | Dobbertin et al. |
| 2013/0105843 A1* | 5/2013 | Lee .................... C23C 14/24 257/98 |

FOREIGN PATENT DOCUMENTS

| | | |
|---|---|---|
| JP | 2009-252458 A | 10/2009 |
| JP | 2011-521482 A | 7/2011 |
| WO | WO-2009/011327 A1 | 1/2009 |
| WO | WO-2009/069717 A1 | 6/2009 |
| WO | WO-2009/143801 A1 | 12/2009 |
| WO | WO-2010/064655 A1 | 6/2010 |
| WO | WO-2010/134352 A1 | 11/2010 |

* cited by examiner

LIGHT-EMITTING DEVICE, ELECTRONIC EQUIPMENT, AND METHOD FOR PRODUCING LIGHT-EMITTING DEVICE

CROSS REFERENCE TO RELATED APPLICATIONS

This application is the National Phase of PCT/JP2013/071997, filed Aug. 16, 2013, which claims priority to Japanese Application No. 2012-181230, filed Aug. 17, 2012.

TECHNICAL FIELD

The present invention relates to a light-emitting apparatus, electronic equipment, and a method for producing the light-emitting apparatus.

BACKGROUND ART

A liquid crystal display apparatus and the like have been typically used as a light-emitting apparatus used for a display. In recent years, as another light-emitting apparatus, an organic electroluminescent light-emitting apparatus using an organic electroluminescent device (hereinafter, occasionally abbreviated as an "organic EL device") also has been put into practical use. In the organic EL device, a light-emitting unit including a light-emitting layer is provided between an anode and a cathode and light emission is provided by exciton energy generated by recombination of holes and electrons injected to the emitting layer.

A light-emitting apparatus used for a color display is mainly exemplified by a three-color light-emitting apparatus and a color-filter light-emitting apparatus.

In the three-color light-emitting apparatus, a color display is obtained by forming devices capable of respectively emitting light in three primary colors of red (R), green (G) and blue (B) and controlling a luminous intensity of each of the three colors. However, the three-color light-emitting apparatus requires a high-definition coating using a metal mask when coating, evaporation or the like is performed in order to form light-emitting layers that emit the respective colors of RGB.

On the other hand, in the color-filter light-emitting apparatus, a white light-emitting device and a color filter are used. White light is converted into three colors of RGB by passing through the color filter. Since the color-filter light-emitting apparatus does not require a high-definition coating, the color-filter light-emitting apparatus can be manufactured more easily than the three-color light-emitting apparatus.

The white light-emitting device exemplarily includes: an anode; a cathode; and a single light-emitting unit interposed between the anode and the cathode, in which two light-emitting layers are laminated to each other in the light-emitting unit. The two light-emitting layers simultaneously emit light, thereby providing white light emission as the entire light-emitting unit.

Another arrangement of the white light-emitting device is a so-called tandem arrangement including an anode, a cathode, a plurality of light-emitting units interposed between the anode and the cathode, in which the light-emitting units are laminated to each other through an intermediate layer (e.g., an intermediate electrode) therebetween.

Patent Literature 1 discloses a display apparatus including the tandem organic EL device in combination with a color filter.

The organic electroluminescence device included in the display apparatus disclosed in Patent Literature 1 is provided by a white light-emitting device that includes: an anode; a cathode; a first light-emitting unit having a red light-emitting layer and a green light-emitting layer; a second light-emitting unit having a blue light-emitting layer; and a connection layer (intermediate layer) interposed between the first and second light-emitting units, the first and second light-emitting units and the intermediate layer being provided between the anode and the cathode. In the display apparatus disclosed in Patent Literature 1, the white light-emitting devices are disposed to the respective RGB filters. When each of the white light-emitting devices emits white light, the white light passes through the color filters to convert the color of the light.

CITATION LIST

Patent Literature

Patent Literature 1: JP-A-2006-324016

SUMMARY OF THE INVENTION

Problems to be Solved by the Invention

However, in the display apparatus disclosed in Patent Literature 1, since light emission in each of RGB colors is independently extracted from the while light emission, some luminescence components are in vain. For instance, in order to display blue light using the light-emitting device, not only a blue light-emitting layer but also a red light-emitting layer and a green light-emitting layer emits light. Accordingly, power for making the red light-emitting layer and the green light-emitting layer to emit light is consumed in vain.

Since reduction in consumption power used for the light-emitting apparatus is desired, an unnecessary power consumption as disclosed in Patent Literature 1 is controversial.

An object of the invention is to provide a light-emitting apparatus capable of reducing power consumption and a manufacturing method of the light-emitting apparatus. Another object of the invention is to provide electronic equipment provided with the light-emitting apparatus.

Means for Solving the Problems

According to an aspect of the invention, a light-emitting apparatus includes: a first light-emitting device that includes a first light-emitting unit, a second light-emitting unit, and a first intermediate layer interposed between the first light-emitting unit and the second light-emitting unit, the first light-emitting unit, the second light-emitting unit and the first intermediate layer being laminated to each other; a second light-emitting device that includes a third light-emitting unit that is formed in the same step as the first light-emitting unit, a fourth light-emitting unit that is formed in the same step as the second light-emitting unit, and a second intermediate layer that is formed in the same step as the first intermediate layer, the third light-emitting unit, the fourth light-emitting unit and the second intermediate layer being laminated to each other; and a device driving portion that includes a first drive transistor for driving the first light-emitting device and a second drive transistor for driving the second light-emitting device, in which the first light-emitting unit and the third light-emitting unit each have a first color light-emitting layer that emits a first color light, the second light-emitting unit and the fourth light-emitting unit each have a second color light-emitting layer that emits a second color light, the first drive transistor drives the first light-emitting unit to make the first light-emitting device emit the first color light or drives the second light-emitting unit to make the first light-emitting device emit the second color light, and the second drive transistor drives the third light-emitting unit or the fourth light-emitting unit to make the second light-emitting device emit a color light different from the color light emitted from the first light-emitting device.

According to another aspect of the invention, a light-emitting apparatus includes: a first light-emitting device that includes a first light-emitting unit, a second light-emitting unit, and a first intermediate layer interposed between the first light-emitting unit and the second light-emitting unit, the first light-emitting unit, the second light-emitting unit and the first intermediate layer being laminated to each other; a second light-emitting device that includes a third light-emitting unit that is formed in the same step as the first light-emitting unit, a fourth light-emitting unit that is formed in the same step as the second light-emitting unit, and a second intermediate layer that is formed to have the same arrangement as the first intermediate layer, the third light-emitting unit, the fourth light-emitting unit and the second intermediate layer being laminated to each other; and a device driving portion that includes a first drive transistor for driving the first light-emitting device and a second drive transistor for driving the second light-emitting device, in which the first light-emitting unit and the third light-emitting unit each have a first color light-emitting layer that emits a first color light, the second light-emitting unit and the fourth light-emitting unit each have a second color light-emitting layer that emits a second color light, the first drive transistor drives the first light-emitting unit and the second light-emitting unit to make the first light-emitting device emit the first color light and the second color light, and the second drive transistor drives the third light-emitting unit to make the second light-emitting device emit the first color light or drives the fourth light-emitting unit to make the second light-emitting device emit the second color light.

According to still another aspect of the invention, a light-emitting apparatus includes: a first light-emitting device that includes a first light-emitting unit, a second light-emitting unit, and a first intermediate layer interposed between the first light-emitting unit and the second light-emitting unit, the first light-emitting unit, the second light-emitting unit and the first intermediate layer being laminated to each other; a second light-emitting device that includes a third light-emitting unit that is formed to have the same arrangement as the first light-emitting unit, a fourth light-emitting unit that is formed to have the same arrangement as the second light-emitting unit, and a second intermediate layer that is interposed between the third light-emitting unit and the fourth light-emitting unit and is formed to have the same arrangement as the first intermediate layer, the third light-emitting unit, the fourth light-emitting unit and the second intermediate layer being laminated to each other; and a device driving portion that includes a first drive transistor for driving the first light-emitting device and a second drive transistor for driving the second light-emitting device, in which the first light-emitting unit and the third light-emitting unit each have a first color light-emitting layer that emits a first color light, the second light-emitting unit and the fourth light-emitting unit each have a second color light-emitting layer that emits a second color light, the first drive transistor drives the first light-emitting unit to make the first light-emitting device emit the first color light or drives the second light-emitting unit to make the first light-emitting device emit the second color light, and the second drive transistor drives the third light-emitting unit or the fourth light-emitting unit to make the second light-emitting device emit a color light different from the color light emitted from the first light-emitting device.

It should be noted that "the same arrangement" in the description for the light-emitting unit and the intermediate layer as described above means a single layer arrangement or a laminated arrangement having the same film thickness and lamination order as being visually recognizable enough to have been manufactured in the same step. The same applies to the following.

According to further aspect of the invention, a light-emitting apparatus includes: a first light-emitting device that includes a first light-emitting unit, a second light-emitting unit, and a first intermediate layer interposed between the first light-emitting unit and the second light-emitting unit, the first light-emitting unit, the second light-emitting unit and the first intermediate layer being laminated to each other; a second light-emitting device that includes a third light-emitting unit that is formed to have the same arrangement as the first light-emitting unit, a fourth light-emitting unit that is formed to have the same arrangement as the second light-emitting unit, and a second intermediate layer that is interposed between the third light-emitting unit and the fourth light-emitting unit and is formed to have the same arrangement as the first intermediate layer, the third light-emitting unit, the fourth light-emitting unit and the second intermediate layer being laminated to each other; and a device driving portion that includes a first drive transistor for driving the first light-emitting device and a second drive transistor for driving the second light-emitting device, in which the first light-emitting unit and the third light-emitting unit each have a first color light-emitting layer that emits a first color light, the second light-emitting unit and the fourth light-emitting unit each have a second color light-emitting layer that emits a second color light, the first drive transistor drives the first light-emitting unit to make the first light-emitting device emit the first color light or drives the second light-emitting unit to make the first light-emitting device emit the second color light, and the second drive transistor drives the third light-emitting unit to make the second light-emitting device emit the first color light or drives the fourth light-emitting unit to make the second light-emitting device emit the second color light.

According to still further aspect of the invention, a light-emitting apparatus includes: a first light-emitting device; a second light-emitting device; and a device driving portion that includes a first drive transistor for driving the first light-emitting device and a second drive transistor for driving the second light-emitting device, in which the first light-emitting device includes a first electrode, a first light-emitting unit, a second electrode, a second light-emitting unit, and a third electrode in this order, the second light-emitting device includes a third light-emitting unit, a fourth electrode, a fourth light-emitting unit, and a fifth electrode in this order, the first light-emitting unit and the third light-emitting unit are formed in the same step and each have a first color light-emitting layer that emits a first color light, the second electrode and the fourth electrode are formed in the same step, the second light-emitting unit and the fourth light-emitting unit are formed in the same step and each have a second color light-emitting layer that emits a second color light, the first drive transistor is electrically connected to the first electrode, and the second drive transistor is electrically connected to the fourth electrode.

According to still further aspect of the invention, a light-emitting apparatus includes: a first light-emitting device; a second light-emitting device; and a device driving portion that includes a first drive transistor for driving the first light-emitting device and a second drive transistor for driving the second light-emitting device, in which the first light-emitting device includes a first electrode, a first light-emitting unit, a second electrode, a second light-emitting unit, and a third electrode in this order, the second light-emitting device includes an eighth electrode, a fourth electrode, a fourth light-emitting unit, and a fifth electrode in this order, the second electrode and the fourth electrode are formed in the same step, the first light-emitting unit has a first color light-emitting layer that emits a first color light, the second light-emitting unit and the fourth light-emitting unit are formed in the same step and each have a second color light-emitting layer that emits a second color light, the first drive transistor is electrically connected to the first electrode, and the second drive transistor is electrically connected to the eighth electrode.

According to still further aspect of the invention, a light-emitting apparatus includes: a first light-emitting device; a second light-emitting device; a third light-emitting device; and a device driving portion that includes a first drive transistor for driving the first light-emitting device, a second drive transistor for driving the second light-emitting device, and a third drive transistor for driving the third light-emitting device, in which the first light-emitting device includes: a first electrode, a first light-emitting unit, a second electrode, a second light-emitting unit, and a third electrode in this order, the second light-emitting device includes a third light-emitting unit, a fourth electrode, a fourth light-emitting unit, and a fifth electrode in this order, the third light-emitting device includes a fifth light-emitting unit, a sixth electrode, a sixth light-emitting unit, and a seventh electrode in this order, the first light-emitting unit, the third light-emitting unit and the fifth light-emitting unit are formed in the same step and each have a first color light-emitting layer that emits a first color light, the second electrode, the fourth electrode and the seventh electrode are formed in the same step, the second light-emitting unit, the fourth light-emitting unit and the sixth light-emitting unit are formed in the same step and each have a second color light-emitting layer that emits a second color light, the first drive transistor is electrically connected to the first electrode, the second drive transistor is electrically connected to the fourth electrode, and the third drive transistor is electrically connected to the sixth electrode.

According to still further aspect of the invention, a light-emitting apparatus includes: a first light-emitting device; a second light-emitting device; a device driving portion that includes a first drive transistor for driving the first light-emitting device and a second drive transistor for driving the second light-emitting device, in which the first light-emitting device and the second light-emitting device each have an intermediate electrode, the intermediate electrode is electrically divided by an insulating portion between the first light-emitting device and the second light-emitting device into a second electrode and a fourth electrode, the first light-emitting device includes a first electrode, a first light-emitting unit, a second electrode, a second light-emitting unit, and a third electrode in this order, the second light-emitting device includes a third light-emitting unit, a fourth electrode, a fourth light-emitting unit, and a fifth electrode in this order, the first light-emitting unit and the third light-emitting unit each have a first color light-emitting layer that emits a first color light, the second light-emitting unit and the fourth light-emitting unit each have a second color light-emitting layer that emits a second color light, the first drive transistor is electrically connected to the second electrode, and the second drive transistor is electrically connected to the fourth electrode.

According to still further aspect of the invention, a light-emitting apparatus includes: a first light-emitting device; a second light-emitting device; and a device driving portion that includes a first drive transistor for driving the first light-emitting device and a second drive transistor for driving the second light-emitting device, in which the first light-emitting device includes a first electrode, a first light-emitting unit, a second electrode, a second light-emitting unit, and a third electrode in this order, the second light-emitting device includes a third light-emitting unit, a fourth electrode, a fourth light-emitting unit, and a fifth electrode in this order, the first light-emitting unit and the third light-emitting unit are formed in the same step and each have a first color light-emitting layer that emits a first color light, the second electrode and the fourth electrode are formed in the same step, the second light-emitting unit and the fourth light-emitting unit are formed in the same step and each have a second color light-emitting layer that emits a second color light, the first drive transistor is electrically connected to the first electrode, and the second drive transistor is electrically connected to the fourth electrode to avoid a potential difference between ends in a thickness direction of the third light-emitting unit.

According to still further aspect of the invention, a method of manufacturing a light-emitting apparatus, which includes a substrate, a first light-emitting device provided on the substrate, a second light-emitting device provided in a region of the substrate different from a region of the substrate where the first light-emitting device is provided, includes: forming on the substrate a first drive transistor for driving the first light-emitting device and a second drive transistor for driving the second light-emitting device; forming a first electrode in a first region of the substrate where the first light-emitting device is formed to electrically connect the first electrode to the first drive transistor; forming an insulating portion, which is raised from the substrate and having a protrusion that protrudes toward a second region where the second light-emitting device is formed, at a position for dividing the first region and the second region; forming a first color light-emitting unit comprising a first color light-emitting layer that emits a first color light, across the insulating portion over the first and second regions; forming an intermediate electrode across the insulating portion over the first region and the second region to electrically connect the intermediate electrode in the second region to the second drive transistor; and forming a second color light-emitting unit comprising a second color light-emitting layer that emits a second color light, across the insulating portion over the first and second regions.

DESCRIPTION OF EMBODIMENTS

First Exemplary Embodiment

A first exemplary embodiment of the invention will be described with reference to the drawings.

Light-Emitting Apparatus

Figure 1:
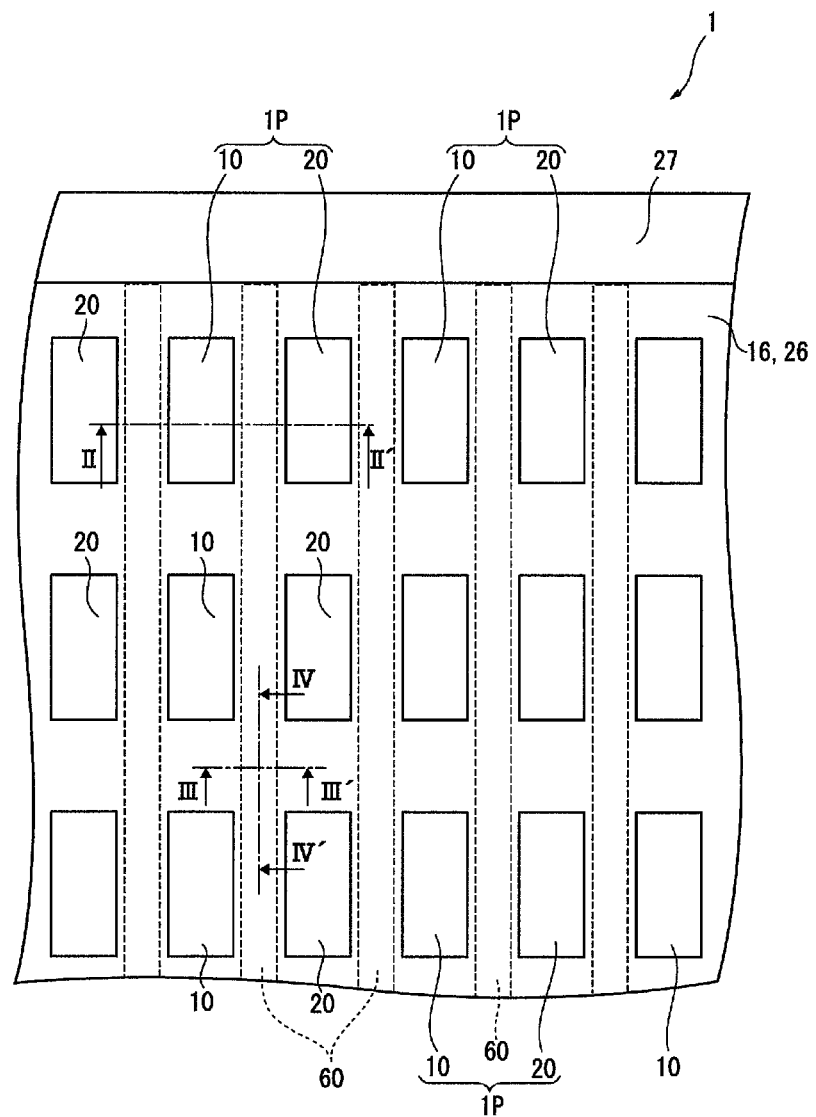
FIG. 1 is a plan view showing a light-emitting apparatus according to a first exemplary embodiment.

FIG. 1 is a plan view showing a part of a light-emitting apparatus 1 according to the first exemplary embodiment.

The light-emitting apparatus 1 includes a first light-emitting device 10 and a second light-emitting device 20.

In the first exemplary embodiment described below, the first light-emitting device 10 and the second light-emitting device 20 are described with reference to an example in which an organic electroluminescence device (hereinafter, occasionally abbreviated as an organic EL device) is used as an organic light-emitting device. It should be noted that the invention is not limited to the light-emitting apparatus using the organic EL device as the light-emitting device.

In the light-emitting apparatus 1, a pixel 1P (a display unit) is defined including the first light-emitting device 10 and the second light-emitting device 2. The light-emitting apparatus 1 includes a plurality of pixels 1P. The plurality of pixels 1P are arranged in a matrix as a whole to form a light-emitting region. For instance, as shown in FIG. 1, the first light-emitting devices 10 are substantially equidistant to each other in a longitudinal direction and the second light-emitting devices 20 are substantially equidistant to each other in the longitudinal direction. Moreover, as shown in FIG. 1, each of the first light-emitting devices 10 and each of the second light-emitting devices 20 are alternately provided in a traverse direction. An insulating portion 60 for partitioning and electrically insulating the first light-emitting device 10 from the second light-emitting device 20 is formed between the first light-emitting device 10 and the second light-emitting device 20.

Figure 2:
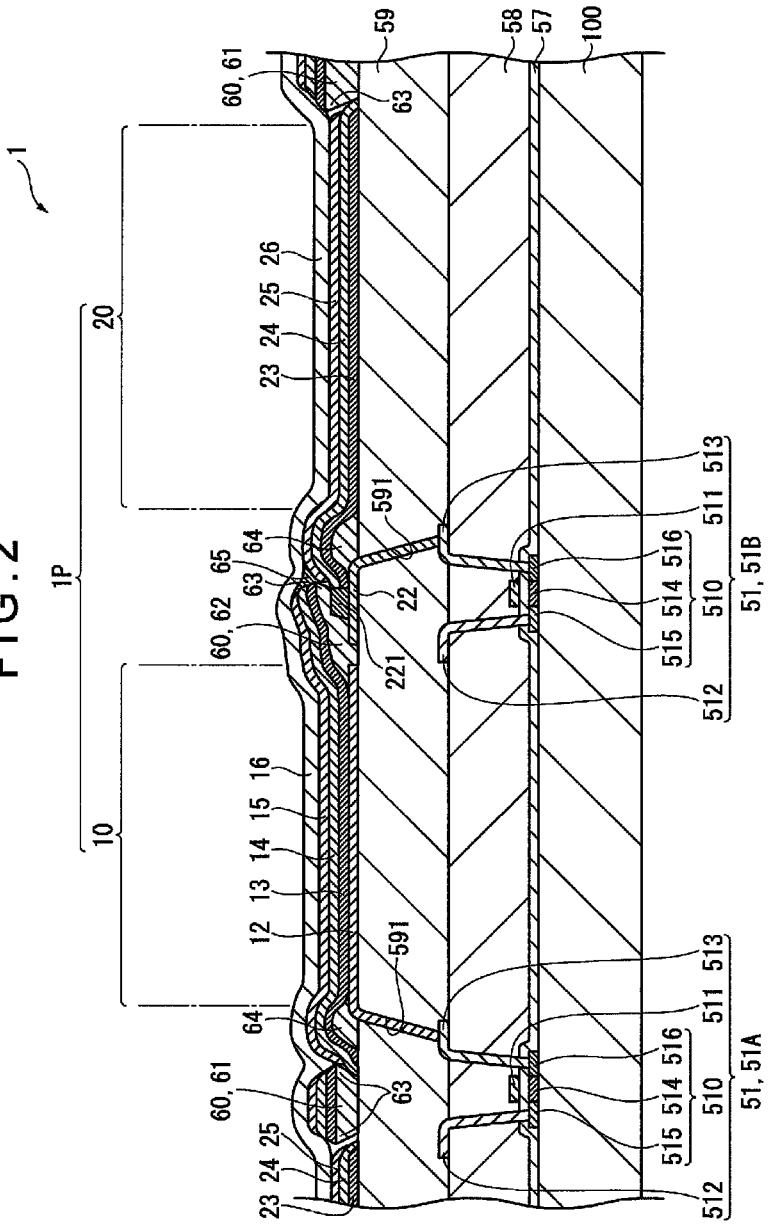
FIG. 2 is a schematic cross-sectional view in a substrate thickness direction showing the light-emitting apparatus according to the first exemplary embodiment.

FIG. 2 is a schematic cross-sectional view in a substrate thickness direction showing the light-emitting apparatus 1 according to the first exemplary embodiment and shows a cross-sectional view taken along II-II' line of FIG. 1 in a direction of arrows.

In the light-emitting apparatus 1, the first light-emitting device 10 and the second light-emitting device 20 are provided on a substrate 100. It should be noted that, in the description of the exemplary embodiments, a description in relation to a top and a bottom (or up and down) refers to an arrangement in which the substrate 100 is positioned at the bottom and the light-emitting devices 10 and 20 are positioned at the top.

Substrate

The substrate 100 is a flat plate member for supporting the first light-emitting device 10 and the second light-emitting device 20. The light-emitting apparatus 1 is a so-called bottom emission device in which irradiation light from the first light-emitting device 10 and the second light-emitting device 20 is extracted through the substrate 100. Accordingly, the substrate 100 is preferably a light-transmissive plate that transmits 50% or more of light in a visible region of 400 nm to 700 nm. The substrate 100 is exemplarily a glass plate, a polymer plate or the like. Specifically, examples of the glass plate include soda-lime glass, barium/strontium-containing glass, lead glass, aluminosilicate glass, borosilicate glass, barium borosilicate glass, and quartz. For the polymer plate, materials such as polycarbonate resins, acryl resins, polyethylene terephthalate resins, polyether sulfide resins, polysulfone resins, and triazine resin can be used. The substrate 100 is not limited to a plate member but may be a film.

First Light-Emitting Device

As shown in FIG. 2, the first light-emitting device 10 is provided in a first region of the substrate 100 and includes a first electrode 12, first light-emitting unit 13, second electrode 14, second light-emitting unit 15, and third electrode 16. In the first exemplary embodiment, the first electrode 12, first light-emitting unit 13, second electrode 14, second light-emitting unit 15, and third electrode 16 are provided in this order from the substrate 100.

Since the second electrode 14 (intermediate electrode) included in an intermediate layer is interposed between the first light-emitting unit 13 and the second light-emitting unit 15 in the first light-emitting device 10, the first light-emitting device 10 has a so-called tandem device arrangement. The intermediate layer is provided between the light-emitting units. In an arrangement in which a plurality of light-emitting units are provided between a pair of electrodes and the intermediate layer is provided between the plurality of light-emitting units, specifically, in such a tandem device arrangement as that of the first light-emitting device 10, the intermediate layer has a function to inject electrons to the light-emitting unit near the anode and a function to inject holes to the light-emitting unit near the cathode. The intermediate layer has a laminated arrangement including ones selected from a donor-containing layer, electro-conductive layer (intermediate electrode) and acceptor-containing layer. The intermediate layer preferably has a laminated arrangement of the donor-containing layer, electro-conductive layer (intermediate electrode) and acceptor-containing layer. The intermediate layer is also preferably provided only by the acceptor-containing layer. The intermediate layer of the first light-emitting device 10 is a first intermediate layer.

The first intermediate layer is a supply source of electrons or holes to be injected into each of the light-emitting units. In addition to charge injected from the pair of electrodes, charge supplied from the intermediate layer is injected into the light-emitting unit. Accordingly, by providing the intermediate layer, luminous efficiency (current efficiency) relative to applied current is improved. An electric conductivity of the intermediate layer is preferably in a range of $10^{-2}$ S/cm to $10^6$ S/cm.

Examples of a material for forming the electric conductive layer include a metal, metal oxide, mixture of metal oxides, metal composite oxide, chalcogenide material and organic semiconductor material. Examples of the metal are preferably Mg, Al, and a film formed by co-evaporating Mg and Ag. Examples of the metal oxide include ZnO, $WO_3$, $MoO_3$ and $MoO_2$. Examples of the mixture of the metal oxides include ITO and IZO (registered trade mark). The acceptor-containing layer contains an electron-accepting material. Examples of the electron-accepting material include the metal oxide, the metal composite oxide and an electron-accepting organic compound. Examples of the electron-accepting organic compound include an organic compound having a CN (cyano) group as a substituent. The organic compound having a CN group is preferably a triphenylene derivative, tetracyanoquinodimethane derivative and indenofluorene derivative. The triphenylene derivative is preferably hexacyanohexaazatriphenylene. The tetracyanoquinodimethane derivative is preferably tetrafluoroquinodimethane and dicyanoquinodimethane. The indenofluorene derivative is preferably a compound disclosed in International Publication WO2009/011327, WO2009/069717, or WO2010/064655. The acceptor-containing layer may be provided only by the electron-accepting substance or may be provided in a mixture with other organic compounds.

The donor-containing layer contains an electron-donating material and is preferably a mixed layer of an electron transporting material and a donor represented by an alkali metal. As the electron-donating material, at least one selected from the group consisting of a donor metal, donor metal compound and donor metal complex can be used.

Examples of the compounds used for the donor metal, donor metal compound and donor metal complex are compounds disclosed in Patent Application Number PCT/JP2010/003434.

Examples of the chalcogenide material include ZnS, ZnSe, CdS, CdTe, MgS, MgSe, ZnSSe, ZnMgSSe, ZnCdSSe, and ZnTeSe.

Examples of the organic semiconductor material include an amorphous carbon, diamond-like carbon, conductive conjugated polymer, oxidizer-added polymer, reduction-causing-agent-added polymer, oxidizer-added low molecular compound and reduction-causing-agent-added low molecular compound.

Examples of the conductive oxides include NbOx, LaOx, NdOx, SmOx, EuOx, MoOx, ReOx, WOx, OsOx, IrOx, and PtOx (x=0.2 to 5).

Light-Emitting Unit

The first light-emitting unit 13 includes a first color light-emitting layer that emits a first color light. The second light-emitting unit 15 includes a second color light-emitting layer that emits a second color light. In the first exemplary embodiment, the first color light is blue and the second color light is yellow. It should be noted that the invention is not particularly limited to the examples of the first and second color lights described in the exemplary embodiments.

Each of the first light-emitting unit 13 and the second light-emitting unit 15 may be provided by a single light-emitting layer, or alternatively, may further include layers used in a known organic EL device such as a hole injecting layer, a hole transporting layer, an electron injecting layer, an electron transporting layer, a hole blocking layer, and an electron blocking layer. Each of the first light-emitting unit 13 and the second light-emitting unit 15 may independently include an inorganic compound. In the first exemplary embodiment, the first light-emitting unit 13 and the second light-emitting unit 15 form a planar light-emitting region.

Since each of the layers of the first light-emitting unit 13 has the same arrangement as each of the layers of a third light-emitting unit 23 of the second light-emitting device 20, the layers of the first light-emitting unit 13 are formed in the same step substantially over the entire light-emitting region of the light-emitting apparatus 1, whereby high-definition coating using a metal mask and the like becomes unnecessary. Moreover, since each of the layers of the second light-emitting unit 15 has the same arrangement as each of the layers of the fourth light-emitting unit 25 of the second light-emitting device 20, the layers of the second light-emitting unit 15 also can be formed in the same step substantially over the entire light-emitting region of the light-emitting apparatus 1.

Light-Emitting Layer

The light-emitting layer of each of the light-emitting units, which is formed of emitting materials such as $Alq_3$ (tris(8-hydroxyquinolinato)aluminium), provides a single-color emission such as red, green, blue or yellow emission, or combined-color emission of red, green, blue and yellow emission. The light-emitting units each may be formed of a fluorescent material or a phosphorescent material. When the light-emitting units are provided in a combination of the fluorescent material and the phosphorescent material, the light-emitting units may be provided in a sequence of fluorescent emitting unit/phosphorescent emitting unit or phosphorescent emitting unit/fluorescent emitting unit.

In the first exemplary embodiment, the first color light is blue and the first color light-emitting layer of the first light-emitting unit 13 is a fluorescent emitting layer. The second color light is yellow and the second color light-emitting layer of the second light-emitting unit 15 is a phosphorescent emitting layer. It should be noted that the invention is not particularly limited to the examples of types of the light-emitting layer described in the exemplary embodiments.

Moreover, a doping system is generally used in the light-emitting layer. In this case, the light-emitting layer is an organic layer containing a host material and a dopant material. The host material generally promotes recombination of electrons and holes and transmits exciton energy generated by the recombination to the dopant material. The dopant material is preferably a compound having a high quantum efficiency. The dopant material receiving the exciton energy from the host material exhibits a high emitting performance.

Dopant Material

The dopant material is formed of dopant materials used for the organic EL device and selected from a dopant material generating fluorescent emission and a dopant material generating phosphorescent emission.

The dopant material generating fluorescent emission is selected from a fluoranthene derivative, pyrene derivative, aryl acethylene derivative, fluorene derivative, boron complex, perylene derivative, oxadiazole derivative and anthracene derivative. The fluoranthene derivative, pyrene derivative and boron complex are preferable among the above. Such a material generating fluorescent emission is occasionally referred to as a fluorescent dopant material.

The dopant material generating phosphorescent emission preferably contains a metal complex. The metal complex preferably contains: a metal atom selected from iridium (Ir), platinum (Pt), osmium (Os), gold (Au), rhenium (Re) and ruthenium (Ru); and a ligand. Particularly, the ligand and the metal atom preferably form an ortho-metal bond. Such a dopant material generating phosphorescent emission is occasionally referred to as a phosphorescent dopant material.

The phosphorescent dopant material is preferably a compound containing a metal selected from iridium (Ir), osmium (Os) and platinum (Pt) because such a compound, which exhibits high phosphorescence quantum yield, can further enhance external quantum efficiency of the emitting device. The phosphorescent emitting material is more preferably a metal complex such as an iridium complex, osmium complex or platinum complex, among which an iridium complex and platinum complex are more preferable and ortho metalation of an iridium complex is the most preferable. In terms of the luminous efficiency, an organic metal complex including the ligand selected from phenyl quinoline, phenyl isoquinoline, phenyl pyridine, phenyl pyrimidine, phenyl pyrazine and phenyl imidazole is preferable.

One of the dopant material may be used alone, or two or more thereof may be used in combination.

Host Material

The host material, which is formed of a host material used for the organic EL device, is exemplified by an amine derivative, azine derivative and fused polycyclic aromatic derivative.

Examples of the amine derivative are a monoamine compound, diamine compound, triamine compound, tetramine compound and amine compound substituted by a carbazole group.

Examples of the azine derivative are a monoazine derivative, diazine derivative and triazine derivative.

The fused polycyclic aromatic derivative is preferably a fused polycyclic aromatic hydrocarbon having no heterocyclic skeleton. Examples of the fused polycyclic aromatic derivative are the fused polycyclic aromatic hydrocarbon such as naphthalene, anthracene, phenanthrene, chrysene, fluoranthene and triphenylene, or derivatives thereof.

Specific examples of the host material in the emitting layer containing the phosphorescent dopant include a carbazole derivative, triazole derivative, oxazole derivative, oxadiazole derivative, imidazole derivative, polyarylalkane derivative, pyrazoline derivative, pyrazolone derivative, phenylenediamine derivative, arylamine derivative, amino-substituted chalcone derivative, styryl anthracene derivative, fluorenone derivative, hydrazone derivative, stilbene derivative, silazane derivative, aromatic tertiary amine compound, styrylamine compound, aromatic dimethylidene compound, porphyrin compound, anthraquinodimethane derivative, anthrone derivative, diphenylquinone derivative, thiopyrandioxide derivative, carbodiimide derivative, fluorenylidenemethane derivative, distyryl pyrazine derivative, hyterocyclic tetracarboxylic acid anhydride such as naphthaleneperylene, phthalocyanine derivative, various metal complex, polysilane compounds, poly(N-vinylcarbazole) derivative, aniline copolymer, conductive high-molecular weight oligomers and high-molecular weight compounds. Examples of the various metal complexes include a metal complex of 8-quinolynol derivative and a metal complex including metal phthalocyanine, benzoxazole and benzothiazole as a ligand. Examples of the conductive high-molecular weight oligomer include a thiophene oligomer and polythiophene. Examples of the high-molecular weight compound herein include a polythiophene derivative, polyphenylene derivative, polyphenylenevinylene derivative and polyfluorene derivative.

One of the host materials may be used alone, or two or more thereof may be used in combination.

The respective light-emitting layers of the first light-emitting unit 13 and the second light-emitting unit 15 may contain a dopant material of the same emission type. Specifically, when the light-emitting layer of the first light-emitting unit 13 contains a fluorescent dopant material, the light-emitting layer of the second light-emitting unit 15 also may contain a fluorescent dopant material. When the light-emitting layer of the first light-emitting unit 13 contains a phosphorescent dopant material, the light-emitting layer of the second light-emitting unit 15 also may contain a phosphorescent dopant material.

When the respective light-emitting layers of the first light-emitting unit 13 and the second light-emitting unit 15 contain a plurality of light-emitting layers, the plurality of light-emitting layers also may contain dopant materials of different emission type. Specifically, one of the light-emitting layers may contain the fluorescent dopant material while the other of the emitting layers may contain the phosphorescent dopant material.

The combinations of the emission types of the dopant materials also apply to a case where three or more light-emitting units are laminated.

In addition to the above exemplary compounds, any compound selected from compounds used in a typical organic El device is usable as a compound for the respective light-emitting layers of the first light-emitting unit 13 and the second light-emitting unit 15 as well as other layers.

First Electrode and Third Electrode

In the first exemplary embodiment, the first electrode 12 is the anode and the third electrode 16 is the cathode.

The anode of the organic EL device is used for injecting holes into the hole injecting layer, the hole transporting layer or the emitting layer. It is effective that the anode has a work function of 4.5 eV or more.

Specific examples of a material for the anode are alloys of indium-tin oxide (ITO), tin oxide (NESA), indium zinc oxide, gold, silver, platinum and copper.

The anode is manufactured by forming a thin film of the electrode substance by vapor deposition, sputtering or the like. In the first exemplary embodiment, the first electrode 12 (the anode) is selectively formed in the first region in which the first light-emitting device 10 is formed.

When light from the emitting layer is to be extracted through the anode (first electrode 12), the anode preferably transmits more than 10% of the light in the visible region. Sheet resistance of the anode is preferably several hundreds $\Omega$/square or less. The thickness of the anode is typically in a range of 10 nm to 1 μm, and preferably in a range of 10 nm to 200 nm, though it depends on the material of the anode.

The cathode is preferably formed of a material with smaller work function in order to inject electrons into the electron injecting layer, the electron transporting layer and the emitting layer.

Although a material for the cathode is not particularly limited, examples of the material are indium, aluminium, magnesium, alloy of magnesium and indium, alloy of magnesium and aluminium, alloy of aluminium and lithium, alloy of aluminium, scandium and lithium, and alloy of magnesium and silver.

Similar to the anode, the cathode may be manufactured by forming a thin film on the electron transporting layer or the electron injecting layer through a method such as vapor deposition and sputtering. In the first exemplary embodiment, the third electrode 16 is a common electrode formed of the same material as the fifth electrode 26 of the second light-emitting device 20 in the same step substantially over the whole light-emitting region of the light-emitting apparatus 1.

In addition, light from the light-emitting layer may be extracted through the cathode (third electrode 16). When light from the emitting layer is to be emitted through the cathode, the cathode preferably transmits more than 10% of the light in the visible region.

Sheet resistance of the cathode is preferably several hundreds Ω per square or less.

The film thickness of the cathode is typically in a range of 10 nm to 1 μm, and preferably in a range of 50 nm to 200 nm, though it depends on the material of the cathode.

It should be noted that the invention is not limited to the first exemplary embodiment but the third electrode 16 may be the anode and the first electrode 12 may be the cathode depending on a driving method of the light-emitting apparatus 1.

Second Light-Emitting Device

As shown in FIG. 2, the second light-emitting device 20 is provided in a second region different from the first region on the substrate 100 and is adjacent to the first light-emitting device 10. The second light-emitting device 20 includes the third light-emitting unit 23, fourth electrode 24, fourth light-emitting unit 25 and fifth electrode 26. In the first exemplary embodiment, the third light-emitting unit 23, fourth electrode 24, fourth light-emitting unit 25 and fifth electrode 26 are provided in this order from the substrate 100.

Similar to the first light-emitting device 10, the second light-emitting device 20 also has a device arrangement in which the fourth electrode 24 (intermediate electrode) is interposed between the third light-emitting unit 23 and the fourth light-emitting unit 25. The intermediate layer is provided between the light-emitting units as described above. In the second light-emitting device 20, the third light-emitting unit 23 and the fourth light-emitting unit 25 are not provided between a pair of electrodes. Accordingly, the fourth electrode 24 is an intermediate layer (second intermediate layer) in the second light-emitting device 20 and simultaneously corresponds to the anode in the second light-emitting device 20. The fourth electrode 24 is electrically connected to a device driving portion and simultaneously functions as an electrode to supply carriers (holes) to the fourth light-emitting unit. Accordingly, the fourth electrode 24 includes a charge generating layer or a conductive layer. The conductive layer contains a conductive material or semiconductive material. Since the fourth electrode 24 of the second light-emitting device 20 has the same arrangement as the second electrode 14 of the first light-emitting device, the first and second intermediate layers are formed in the same step substantially over the whole light-emitting region of the light-emitting apparatus 1, whereby high-definition coating using a metal mask and the like becomes unnecessary.

As described above, the fifth electrode 26 is a common electrode with the third electrode 16 of the first light-emitting device 10 and is formed in the same step substantially over the whole light-emitting region of the light-emitting apparatus 1.

Light-Emitting Unit

The third light-emitting unit 23 includes the first color light-emitting layer that is capable of emitting the same first color light as that of the first light-emitting unit 13. The fourth light-emitting unit 25 includes the second color light-emitting layer that emits the same second color light as that of the second light-emitting unit 15. In the first exemplary embodiment, the third light-emitting unit 23 and the fourth light-emitting unit 25 form a planar light-emitting region.

In the first exemplary embodiment, since the third light-emitting unit 23 is not held between the electrodes as shown in FIG. 2, there is no potential difference between both ends in a thickness direction of the third light-emitting unit 23 when the light-emitting apparatus 1 is driven, so that the third light-emitting unit 23 doest not emit. On the other hand, the fourth light-emitting unit 25 held between the fourth electrode 24 and the fifth electrode 26 emits the second color light.

It should be noted that, since the respective arrangements of the third light-emitting unit 23 and the fourth light-emitting unit 25 other than the above are the same as that in the first light-emitting device, the description is omitted.

Figure 3:
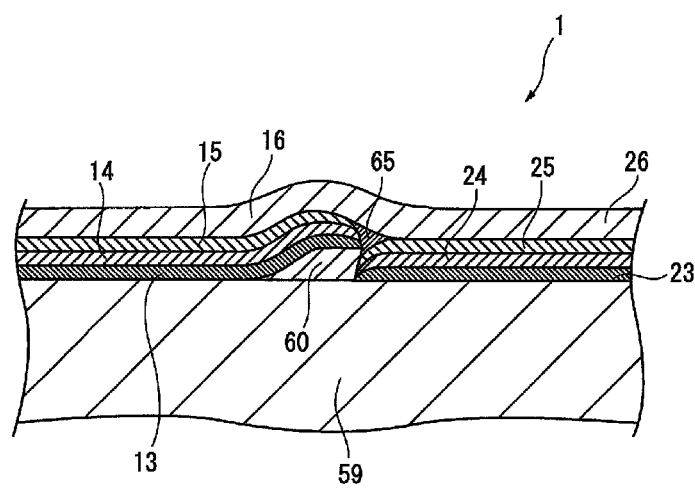
FIG. 3 is another schematic cross-sectional view in the substrate thickness direction showing the light-emitting apparatus according to the first exemplary embodiment.

FIG. 3 is a schematic cross-sectional view in the substrate thickness direction showing the light-emitting apparatus 1 and shows a cross sectional view taken along III-III' line of FIG. 1 in a direction of arrows.

As shown in FIG. 3, the insulating portion 60 is provided between the region where the first light-emitting device 10 is provided and the region where the second light-emitting device 20 is provided. Moreover, as shown in FIG. 1, the insulating portion 60 is provided between the region where the first light-emitting device 10 is provided and the region where the second light-emitting device 20 is provided in the longitudinal direction, so that the regions are divided. As shown in FIG. 3, the raised insulating portion 60 forms a step. This step disconnects the layers of the first light-emitting device 10 from the layers of the second light-emitting device 20, so that the second electrode 14 of the first light-emitting device 10 is not electrically connected with the fourth electrode 24 of the second light-emitting device 20.

Figure 4:
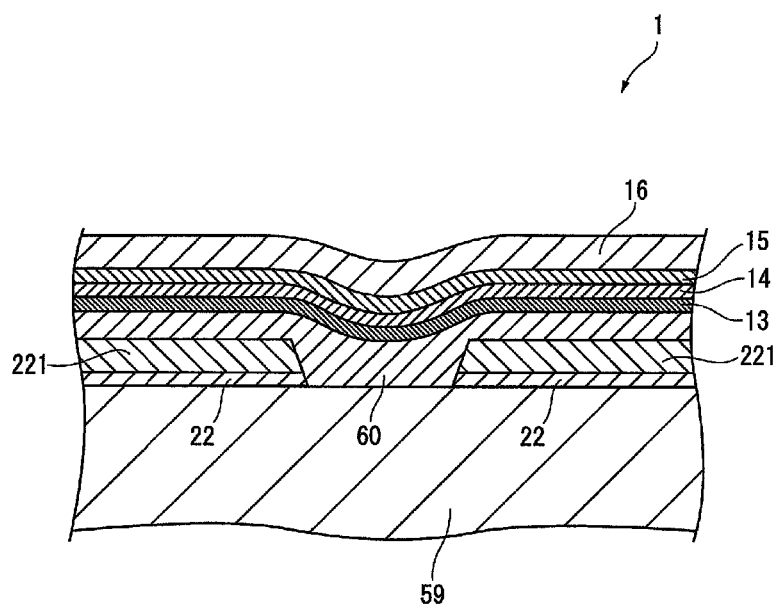
FIG. 4 is still another schematic cross-sectional view in the substrate thickness direction showing the light-emitting apparatus according to the first exemplary embodiment.

FIG. 4 is a schematic cross-sectional view in the substrate thickness direction showing the light-emitting apparatus 1 and shows a cross sectional view taken along IV-IV' line of FIG. 1 in a direction of arrows.

As shown in FIG. 4, the layers of the first light-emitting device 10 are continuous to those of the adjacent first light-emitting device 10, so that the second electrode 14 is not divided.

Device Driving Portion

Figure 5:
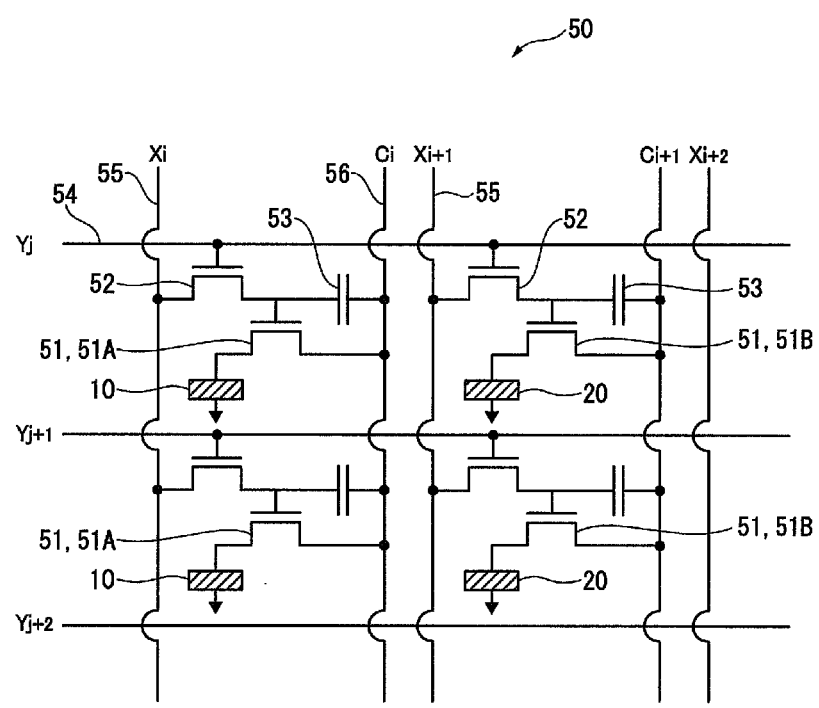
FIG. 5 is a schematic view of a device driving circuit for driving a light-emitting device of the light-emitting apparatus according to the first exemplary embodiment.

FIG. 5 shows a device driving circuit 50 as the device driving portion.

The light-emitting apparatus 1 includes the device driving circuit 50 for driving the first light-emitting device 10 and the second light-emitting device 20. The device driving circuit 50, which is a so-called active driving circuit, is supported on the substrate 100 and includes a drive transistor 51, switching transistor 52 and capacitor device 53. The drive transistor 51 for driving the first light-emitting device 10 is a first drive transistor 51A. The drive transistor 51 for driving the second light-emitting device 20 is a second drive transistor 51B.

On the substrate 100, a scanning electrode wire 54 is provided in one direction and a signal electrode wire 55 and a common power wire 56 are provided intersecting with the scanning electrode wire 54. At a portion where the scanning electrode wire 54 intersects with the signal electrode wire 55 and a portion where the scanning electrode wire 54 intersects with the common power wire 56, an interlayer insulating film or the like is formed of an insulative material to avoid electrical connection.

The drive transistor 51 and the switching transistor 52 are provided by a typical thin film transistor (TFT). An arrangement of the TFT may be, for instance, an inverse-staggered arrangement (so-called bottom gate type) or a staggered arrangement (top gate type).

The dive transistor 51 includes a drive semiconductor layer 510, drive gate electrode 511, drive source electrode 512 and drive drain electrode 513 (see FIG. 2).

The switching transistor 52 includes a switching semiconductor layer, switching gate electrode, switching source electrode and switching drain electrode (which are not shown).

The capacitor device 53 includes a first capacitor plate and a second capacitor plate which are disposed opposing each other through the interlayer insulating film as a derivative. In the capacitor device 53, a capacitor volume is determined according to stored charges and a voltage between the first and second capacitor plates.

The switching transistor 52 is used as a switching device that selects a target light-emitting device for emission. The switching gate electrode is connected to the scanning electrode wire 54. The switching source electrode is connected to the signal electrode wire 55. The switching drain electrode is spaced from the switching source electrode and is connected to the first capacitor plate of the capacitor device 53.

The drive transistor 51 applies to the light-emitting devices 10 and 20 a driving voltage for making the light-emitting devices 10 and 20 within selected pixel(s) emit light. The drive gate electrode 511 of the drive transistor 51 is connected to the first capacitor plate of the capacitor device 53. The drive source electrode 512 and the second capacitor plate of the capacitor device 53 are connected to the common power wire 56. The drive drain electrode 513 is electrically connected to the first electrode 12 of the first light-emitting device 10 or the fourth electrode 24 of the second light-emitting device 20 through an electrode provided to a connection hole 591 penetrating in a thickness direction of a flattening film 59 (see FIG. 2).

The switching transistor 52 is activated by a gate voltage applied to the scanning electrode wire 54 to transmit a data voltage applied to the signal electrode wire 55 to the drive transistor 51. A voltage equivalent to a difference between the common voltage applied to drive transistor 51 by the common power wire 56 and the data voltage transmitted from the switching transistor 52 is stored in the capacitor device 53. Electric current for the voltage stored in the capacitor device 53 flows to the first light-emitting device 10 and the second light-emitting device 20 through the drive transistor 51.

The drive semiconductor layer 510 is formed on the substrate 100 (see FIG. 2). The drive semiconductor layer 510 is formed of a polysilicon film in the first exemplary embodiment. It should be noted that the material of the drive semiconductor layer is not limited to the examples described in the exemplary embodiment, but may be exemplified by amorphous silicon and continuous grain boundary silicon.

The drive semiconductor layer 510 includes a channel region 514 not doped with impurities, a source region 515 and a drain region 516 which are doped with impurities and respectively provided on lateral sides of the channel region 514.

In the first exemplary embodiment, a doping substance is P-type impurities such as boron. The doping impurities are changed as needed depending on types of the thin film transistor.

Although the PMOS-structured thin film transistor using the P-type impurities is used as the drive transistor 51 in the first exemplary embodiment, it is not necessary to use the PMOS-structured thin film transistor. An NMOS- or CMOS-structured thin film transistor using N-type impurities may alternatively be used as the drive transistor 51.

A gate insulating film 57 is formed on the drive semiconductor layer 510 (see FIG. 2). The gate insulating film 57 is formed of silicon nitride (SiNx), silicon oxide (SiOx) or the like. Gate wires including the drive gate electrode 511 are formed on the gate insulating film 57. The gate wires further includes the scanning electrode wire 54, the first capacitor plate of the capacitor device 53, and other wires. The drive gate electrode 511 is formed in a manner to overlap with at least a part of the drive semiconductor layer 510, particularly with the channel region 514.

The interlayer insulating film 58 covering the drive gate electrode 511 is formed on the gate insulating film 57 (see FIG. 2). The gate insulating film 57 and the interlayer insulating film 58 have a plurality of through holes from which the source region 515 and the drain region 516 of the drive semiconductor layer 510 are exposed. Similar to the gate insulating film 57, the interlayer insulating film 58 is formed of silicon nitride (SiNx), silicon oxide (SiOx) or the like.

Data wires including the drive source electrode 512 and the drive drain electrode 513 are formed on the interlayer insulating film 58. The data wires further include the signal electrode wire 55, common power wire 56, second capacitor plate of the capacitor device 53, and other wires. The drive source electrode 512 and the drive drain electrode 513 are respectively connected to the source region 515 and the drain region 516 of the drive semiconductor layer 510 through the through holes formed in the interlayer insulating film 58 and the gate insulating film 57.

The drive transistor 51 are thus formed including the drive semiconductor layer 510, drive gate electrode 511, drive source electrode 512 and drive drain electrode 513. The arrangement of the drive transistor 51 is not particularly limited to the above example.

The flattening film 59 is formed on the interlayer insulating film 58 to cover the data wires (see FIG. 2). The flattening film 59 flattens the regions on which the light-emitting devices 10 and 20 are formed. Moreover, the connection hole 591 from which a part of the drive drain electrode 513 is exposed is formed on the flattening film 59. An electrode (the first electrode 12 or a relay electrode 22) is provided in the connection hole 591 and connected to the part of the drive drain electrode 513 on an upper surface of the interlayer insulating film 58.

The flattening film 59 is formed of at least one material selected from an acrylic resin (polyacrylates resin), epoxy resin, phenolic resin, polyamide resin, unsaturated polyester resin, polyphenylene resin (polyphenylen ether resin), polyphenylene sulfide resin, and benzocyclobutene (BCB).

Connection between Light-Emitting Device and Device Driving Circuit

As shown in FIG. 2, the first electrode 12 is formed substantially over the entire surface of the first region in which the first light-emitting device 10 is formed on the flattening film 59.

No film for forming an electrode is formed on the second region in which the second light-emitting device 20 is formed on the flattening film 59. The relay electrode 22 is selectively formed between the first and second regions on the flattening film 59 as shown in FIG. 2. The relay electrode 22 connects the fourth electrode 24 of the second light-emitting device 20 to the drive drain electrode 513 of the drive transistor 51. An auxiliary connector 221 is formed on the relay electrode 22 so as to facilitate the connection between the fourth electrode 24 and the relay electrode 22. The first electrode 12 and the relay electrode 22 are formed of the same material in the same step. The auxiliary connector 221 is separately formed of a conductive material after the relay electrode 22 is formed.

The first electrode 12 and the relay electrode 22 are connected to the drive drain electrode 513 through the connection hole 591 of the flattening film 59.

Insulating Portion

An insulating portion 60 for partitioning and electrically insulating the first light-emitting device 10 from the second light-emitting device 20 is formed between the first light-emitting device 10 and the second light-emitting device 20 which are adjacent to each other on the flattening film 59.

As shown in FIG. 2, the insulating portion 60 includes: a first insulating portion 61 formed at a connection portion of the first light-emitting device 10 and the first drive transistor 51A; a second insulating portion 62 formed at a connection portion of the second light-emitting device 20 and the second drive transistor 51B; a third insulating portion 64 for covering edges of the electrodes; and a fourth insulating portion 65 for preventing electrical connection between the third electrode 16 and the second electrode 14.

The first insulating portion 61 is raised from the substrate 100, so that a step is formed between the first light-emitting device 10 and the second light-emitting device 20. Further, as shown in FIG. 2, the first insulating portion 61 has a protrusion 63 that protrudes toward the first region in which the first light-emitting device 10 is formed and the second region in which the second light-emitting device 20 is formed. The step formed by the first insulating portion 61 is in a so-called inverse tapered shape, in other words, in an inverse trapezoid having a top larger than a bottom. A height of the protrusion 63 is preferably higher than a height of an upper edge of the fourth electrode 24. This height is for securing disconnection between the second electrode 14 and the fourth electrode 24.

As shown in FIG. 2, the second insulating portion 62 is raised from the substrate 100, covers the edge of the first electrode 12, and formed over the relay electrode 22 and the auxiliary connector 221. In the first exemplary embodiment, the respective ends near the second light-emitting device 20 of the first light-emitting unit 13, the second electrode 14 and the second light-emitting unit 15 of the first light-emitting device 10 overlap on the raised second insulating portion 62. The third light-emitting unit 23, fourth electrode 24 and fourth light-emitting unit 25 of the second light-emitting device 20 do not overlap on the raised second insulating portion 62. In the first exemplary embodiment, the step of the second insulating portion 62 is thus formed between the first light-emitting device 10 and the second light-emitting device 20. Since the second insulating portion 62 is interposed between the first electrode 12 and the relay electrode 22 and between the first electrode 12 and the auxiliary connector 221, short circuit between the first light-emitting device 10 and the second light-emitting device 20 is prevented.

Moreover, the second insulating portion 62 also has the protrusion 63 that protrudes toward the second region in which the second light-emitting device 20 is formed. The step formed by the second insulating portion 62 is also in a so-called inverse tapered shape. A portion of the second insulating portion 62 in the first region in which the first light-emitting device 10 is formed is smoothly inclined to form a forward tapered shape and cover the end of the first electrode 12.

In the respective inverse tapered steps of the first insulating portion 61 and the second insulating portion 62, an angle of each of side surfaces of the insulating portions 61 and 62 relative to a surface of the substrate 100, namely, an inclined angle of each of the side surfaces of the insulating portions is preferably 100 degrees or more. In view of a manufacturing yield, the inclined angle is more preferably 170 degrees or less, further preferably 140 degrees or less.

A height from a bottom surface (i.e., a surface of the flattening film 59 in the first exemplary embodiment) to a top surface of each of the insulating portions 61 and 62 (i.e., a height of the step) needs to be sufficient at least for disconnection between the second electrode 14 and the fourth electrode 24 and is preferably larger than a thickness of the fourth electrode 24. The height of the step is preferably 100 nm to 500 nm, further preferably 150 nm to 300 nm.

Figure 7:
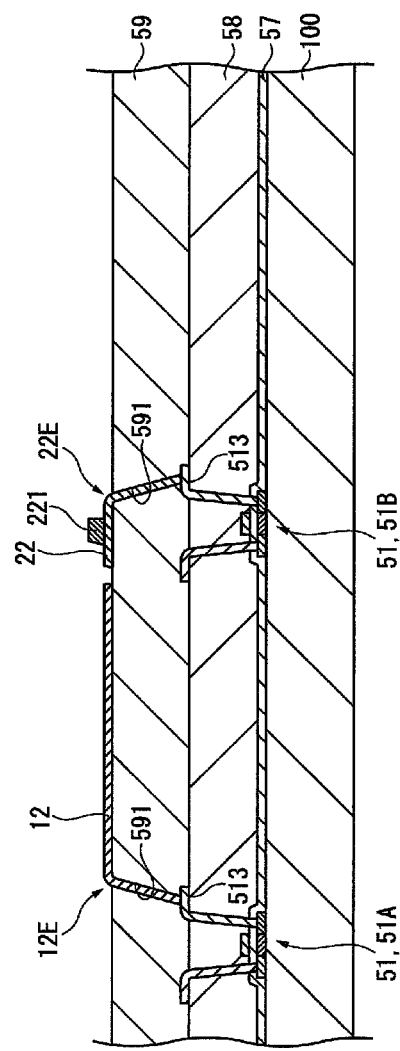
FIG. 7 is a schematic view showing a step of forming an electrode on a substrate on which a device driving portion is formed.

An edge 12E (see FIG. 7) of the first electrode 12 and an edge 22E (see FIG. 7) of the relay electrode 22 are covered with the third insulating portion 64. The third insulating portion 64 prevents the films laminated on the electrodes from being broken.

As shown in FIG. 2, the fourth insulating portion 65 fills a gap at an end of the second electrode 14 near the second light-emitting device 20 so that the second electrode 14 is not exposed from the gap. The fourth insulating portion 65 prevents the end of the second electrode 14 over the second insulating portion 62 from being electrically connected to the third electrode 16.

Examples of a material of the insulating portion 60 include: an acrylic resin, polycarbonate resin, polyimide resin, fluorinated polyimide resin, benzoguanamine resin, melamine resin, cyclic polyolefin, novolak resin, polycinnamate vinyl, cyclized rubber, polyvinyl chloride resin, polystyrene, phenol resin, alkyd resin, epoxy resin, polyurethane resin, polyester resin, maleate resin, and polyamide resin.

When the insulating portion 60 is made of an inorganic oxide, preferable examples of the inorganic oxide include silicon oxide ($SiO_2$ or $SiO_x$), aluminum oxide ($Al_2O_3$ or $AlO_x$), titanium oxide ($TiO_3$ or $TiO_x$), yttrium oxide ($Y_2O_3$ or $YO_x$), germanium oxide ($GeO_2$ or $GeO_x$), zinc oxide (ZnO), magnesium oxide (MgO), calcium oxide (CaO), boric acid ($B_2O_3$), strontium oxide (SrO), barium oxide (BaO), lead oxide (PbO), zirconia ($ZrO_2$), sodium oxide ($Na_2O$), lithium oxide ($Li_2O$), and potassium oxide ($K_2O$). In the above inorganic oxides, $1 \leq x \leq 3$.

The insulating portion 60 can be selectively formed at a predetermined position on the flattening film 59 by a photolithography process and the like.

The layers of the first light-emitting unit 13 are formed over the first region where the first light-emitting device 10 is formed while the layers of the third light-emitting unit 23 are formed over the second region where the second light-emitting device 20 is formed, on the flattening film 59 where the first electrode 12, relay electrode 22, auxiliary connector 221 and insulating portion 60 are formed. As described above, since the layers of the first light-emitting unit 13 and the layers of the third light-emitting unit 23 are the same and are formed of the same material, the layers are manufactured in the same step. At this time, the layers of the first light-emitting unit 13 are disconnected from the layers of the third light-emitting unit 23 by the respective steps of the first insulating portion 61 and the second insulating portion 62. Similar to the light-emitting units 13 and 23, the second electrode 14 and the fourth electrode 24 are respectively formed of the same material in the same step over the first region and the second region. The second light-emitting unit 15 and the fourth light-emitting unit 25 are also respectively formed of the same material in the same step over the first region and the second region. By the inverse tapered insulating portions 61 and 62, the second electrode 14 is disconnected from the fourth electrode 24 while the second light-emitting unit 15 is disconnected from the fourth light-emitting unit 25. In this arrangement, the first light-emitting unit 13, second electrode 14, and second light-emitting unit 15 are placed over the second insulating portion 62 from the first region toward the second region. At the end of the second insulating portion 62 where the first light-emitting unit 13, second electrode 14, and second light-emitting unit 15 are placed, the first light-emitting unit 13, second electrode 14, and second light-emitting unit 15 are respectively disconnected from the third light-emitting unit 23, fourth electrode 24 and fourth light-emitting unit 25 by the inverse tapered step of the second insulating portion 62. On the other hand, the respective ends of the third light-emitting unit 23, fourth electrode 24 and fourth light-emitting unit 25 extend toward the first region and reach a base of the step of the second insulating portion 62. In this arrangement, the fourth electrode 24 is connected to the auxiliary connector 221 formed on the relay electrode 22. In other words, the fourth electrode 24 is connected to the drive drain electrode 513 through the auxiliary connector 221 and the relay electrode 22.

It should be noted that the third electrode 16 and the fifth electrode 26 are provided by a common electrode and are not disconnected from each other by the inverse tapered steps of the insulating portions 61 and 62. A film thickness of the common electrode is preferably in a range of 90 nm to 150 nm. Further, when the film thickness of the common electrode is in the above range, the light-emitting apparatus is preferably of a bottom emission type in which light emitted from a light-emitting unit is extracted through a transmissive substrate.

In the first exemplary embodiment, as shown in FIG. 1, the insulating portion 60 is provided in the longitudinal direction to extend over to ends of the third electrode 16 and the fifth electrode 26. Moreover, in the first exemplary embodiment, a leading electrode 27 is provided at the ends of the third electrode 16 and the fifth electrode 26 to be electrically connected to the third electrode 16 and the fifth electrode 26. The leading electrode 27 is a relay electrode that connects the third electrode 16 and the fifth electrode 26 to a power source. The leading electrode 27 is connected to the power source or a ground point. The leading electrode 27 is provided from the cathode in the traverse direction as shown in FIG. 1. Even if the above common electrode is divided between the third electrode 16 and the fifth electrode 26 by the step of the insulating portion 60, the third electrode 16 and the fifth electrode 26 are independently in electrical connection to the leading electrode 27. Accordingly, failure to provide electricity to the first light-emitting device 10 and the second light-emitting device 20 can be prevented.

In the first exemplary embodiment, the leading electrode 27 is not provided in the longitudinal direction. This arrangement is made for avoiding concentration of electrical current on a single point when the above common electrode is divided into the third electrode 16 and the fifth electrode 26.

Protective Layer and Sealing Substrate

A device protective layer and a sealing substrate may be provided to cover the first light-emitting device 10 and the second light-emitting device 20. The device protective layer is formed of an insulating material such as silicon nitride (SiNx), silicon oxide (SiOx) or the like. The sealing substrate provided on the device protective layer seals the light-emitting devices 10 and 20 in conjunction with the device protective layer, an adhesive layer and the like. When irradiation light from the light-emitting devices 10 and 20 is transmitted through the device protective layer and the sealing substrate, the device protective layer and the sealing substrate are preferably formed of a light-transmissive material (e.g., glass) similar to the substrate 100.

Color Conversion Portion

A color converter 80 having a color conversion portion is provided on a side of the light-emitting apparatus 1 from which light is extracted. The color converter is exemplified by a color filter.

In the first exemplary embodiment, the light-emitting apparatus 1 is a so-called bottom emission device in which irradiation light from the first light-emitting device 10 and the second light-emitting device 20 is extracted through the substrate 100. Accordingly, the color converter 80 is provided to an opposite surface of the substrate 100 from a surface where the first light-emitting device 10 and the second light-emitting device 20 are provided.

Figure 6:
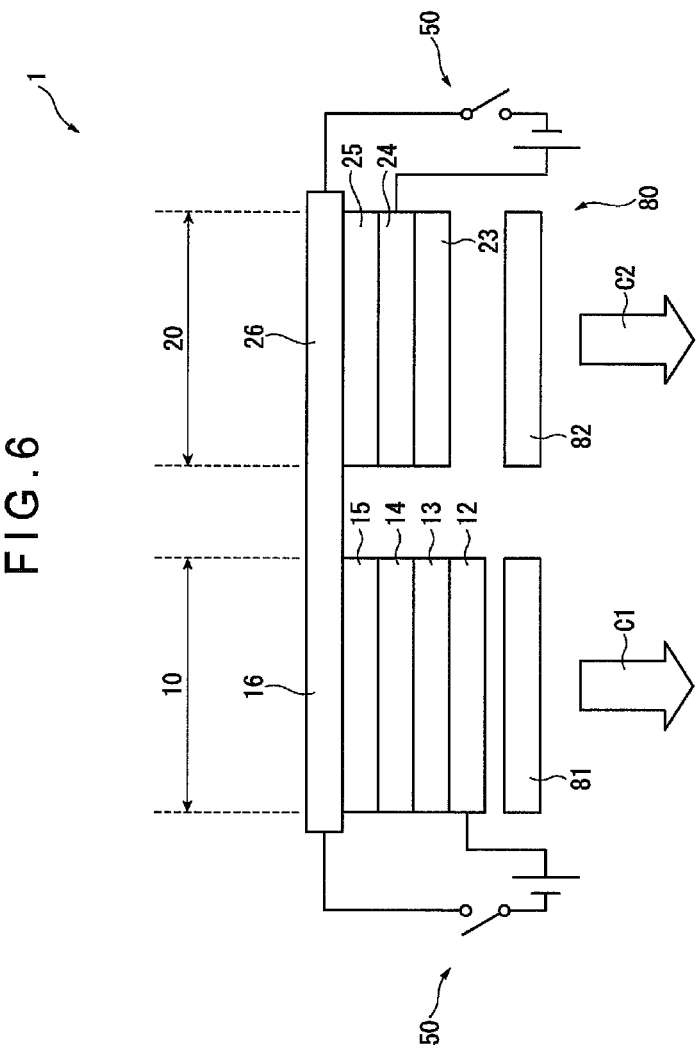
FIG. 6 is a schematic view showing a laminated arrangement of the light-emitting device according to the first exemplary embodiment.

FIG. 6 is a schematic view showing a laminated structure of the first light-emitting device 10 and the second light-emitting device 20 in the light-emitting apparatus 1, in which the color converter 80 is provided on the side of the light-emitting apparatus 1 from which light is extracted.

The color converter 80 includes: a first color conversion portion 81 that transmits a first color light C1 and blocks a second color light C2; and a second color conversion portion 82 that transmits the second color light C2. As shown in FIG. 6, by providing the color converter 80, the first color light C1 can be emitted from a portion of the color converter 80 corresponding to the first light-emitting device 10 while the second color light C2 can be emitted from a portion of the color converter 80 corresponding to the second light-emitting device 20.

Manufacturing Method of Light-Emitting Apparatus

Next, a manufacturing method of the light-emitting apparatus 1 according to the first exemplary embodiment will be described.

FIGS. 7 to 12 are each a schematic view illustrating a manufacturing procedure of the light-emitting apparatus 1 and each show a cross section in the thickness direction of the substrate 100.

Firstly, the device driving circuit 50 (the above device driving portion) is formed on the substrate 100. Subsequently, the first electrode 12, relay electrode 22 and auxiliary connector 221 are formed on the device driving circuit 50. The device driving circuit 50 can be formed according to a known manufacturing method of a TFT substrate. The first electrode 12 and the relay electrode 22 are formed by forming a conductive thin film over the entire flattening film 59 and patterning the film by the photolithography process. The auxiliary connector 221 is formed by selectively coating, for instance, a conductive paste material on the relay electrode 22 by a dispenser method or the like, and heating to calcine the coated material.

Figure 8:
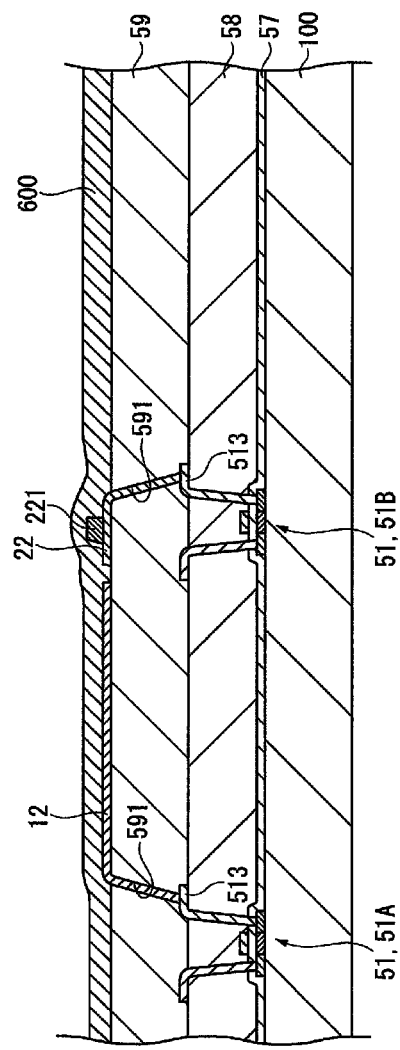
FIG. 8 is a schematic view showing a step of coating a photosensitive-resin-containing ink to form an insulating film.

Next, as shown in FIG. 8, an ink containing a photosensitive resin is coated to form a film. Examples of a coating method of the ink include a spin coating, screen printing and a slit coating. The film formed by coating is prebaked to remove a solvent, thereby forming an insulating film 600.

Figure 9:
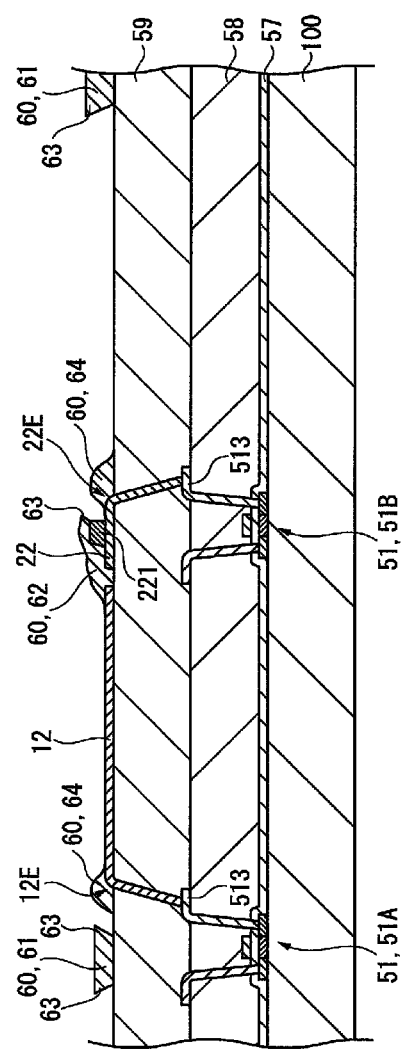
FIG. 9 is a schematic view showing a step of patterning the insulating film at a predetermined position to form an insulating portion.

Next, as shown in FIG. 9, the insulating portion 60 is formed at a predetermined position by patterning the insulating film 600 by the photolithography process.

The photosensitive resin forming the insulating film 600 is provided by a positive-type photosensitive resin and a negative-type photosensitive resin. Both types are usable. When the positive-type photosensitive resin is used, a part of the insulating film 600 other than a part where the insulating portion 60 is to be formed is exposed to irradiation light and developed, so that the unexposed part is left as the insulating portion 60 in a form of a pattern. In contrast, when the negative-type photosensitive resin is used, the part of the insulating film 600 where the insulating portion 60 is to be formed is exposed to irradiation light and developed, so that the unexposed part is removed and the exposed part is left as the insulating portion 60 in a form of a pattern.

In the first exemplary embodiment, a case where a negative-type photosensitive resin is used will be described as an example.

A photomask to block light in a predetermined pattern is placed in a manner to face the surface of the substrate 100 on which the insulating film 600 is formed. A part of the insulating film 600 where the insulating portion 60 is to be formed is exposed to irradiation light through the photomask. In the first exemplary embodiment, an ultraviolet curable resin is used as the photosensitive resin. In the exposure, an ultraviolet ray is irradiated to crosslink the photosensitive resin, thereby curing the insulating film 600.

In order to form the inverse tapered insulating portions 61 and 62 having the protrusion 63, an exposure amount on the insulating film 600 in the thickness direction is adjusted. At this time, the exposure amount is adjusted so that a side of the insulating film 600 facing the photomask is sufficiently crosslinked and cured. On the other hand, the exposure amount is adjusted so that a side of the insulating film 600 near the substrate 100 is crosslinked at a low degree. However, the method of forming the insulating portions 61 and 62 is not limited to the above method.

After the exposure, the unexposed part of the insulating film 600 is developed and removed. In the parts where the insulating portions 61 and 62 are formed, the side of the insulating film 600 near the substrate 100, in which the exposure amount is adjusted to be small, is easy to remove while the side of the insulating film 600 facing the photomask, in which the exposure amount is adjusted to be large, is difficult to remove. In use of such a difference in a removal extent, the inverse tapered step is formed. Development is preferably made so that a side of the auxiliary connector 221 is exposed toward the second region where the second light-emitting device 20 is formed.

A method and a material for peeling the insulating film in the photolithography process are applicable to the development and are appropriately selected depending on the photosensitive resin to be used.

Figure 10:
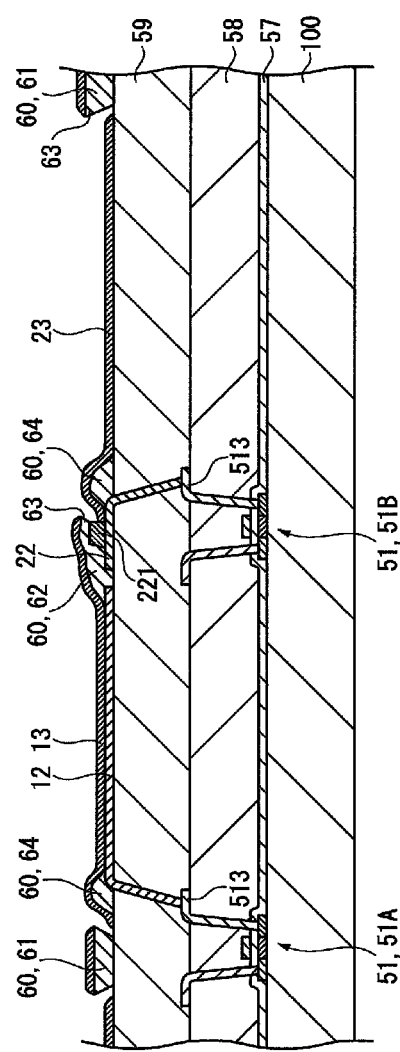
FIG. 10 is a schematic view showing a step of forming a first light-emitting unit and a third light-emitting unit.

Next, as shown in FIG. 10, the first light-emitting unit 13 and the third light-emitting unit 23 are formed in the same step. A material for the layers of the first light-emitting unit 13 and the layers of the third light-emitting unit 23 is used to form a film over the first and second regions across the insulating portions 61 and 62. The layers of the first light-emitting unit 13 are disconnected from the layers of the third light-emitting unit 23 by the inverse tapered steps of the insulating portions 61 and 62.

Figure 11:
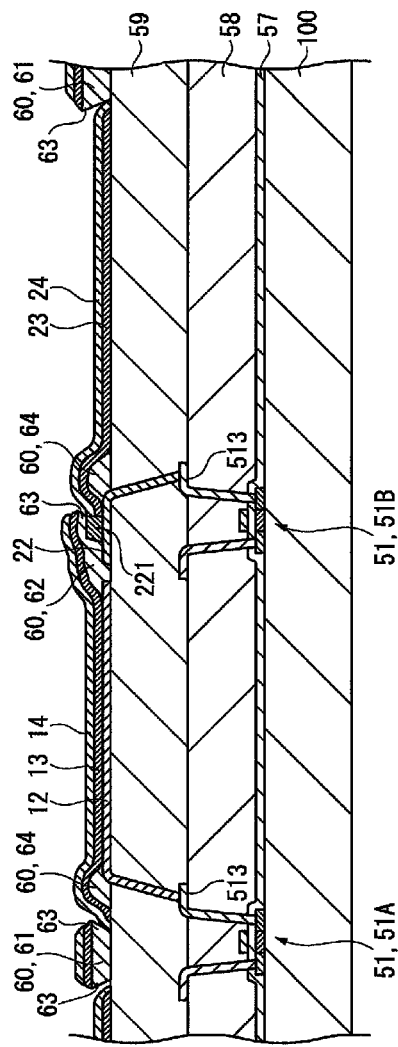
FIG. 11 is a schematic view showing a step of forming a second electrode and a fourth electrode.

Next, as shown in FIG. 11, the second electrode 14 and the fourth electrode 24 are formed in the same step. As described above, a material for forming the second electrode 14 and the fourth electrode 24 is used to form a film over the first and second regions across the insulating portions 61 and 62. The second electrode 14 and the fourth electrode 24 are electrically disconnected from each other by the inverse tapered steps of the insulating portions 61 and 62. The fourth electrode 24 is connected to an end of the auxiliary connector 221 with a lateral surface exposed at the base of the insulating portion 62, so that the fourth electrode 24 is electrically connected to the second drive transistor 51B.

Figure 12:
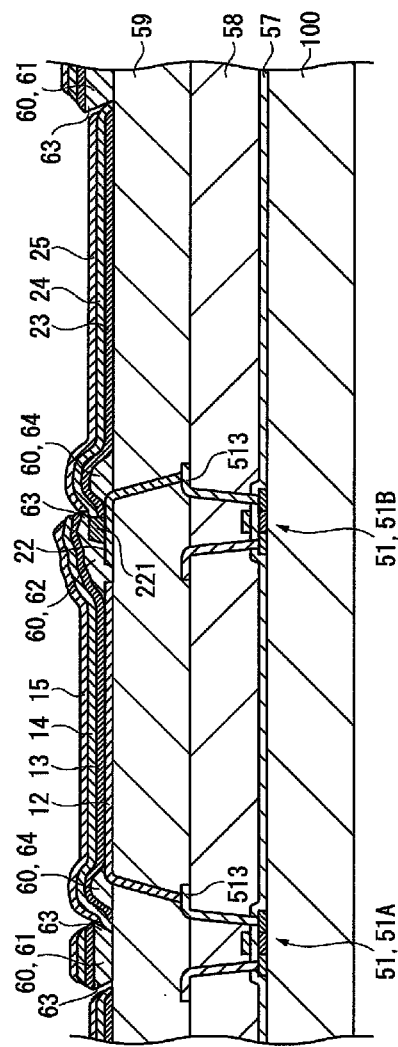
FIG. 12 is a schematic view showing a step of forming a second light-emitting unit and a fourth light-emitting unit.

Next, as shown in FIG. 12, the second light-emitting unit 15 and the fourth light-emitting unit 25 are formed in the same step. As described above, a material for forming the layers of the second light-emitting unit 15 and the layers of the fourth light-emitting unit 25 is used to form a film over the first and second regions across the insulating portions 61 and 62. The layers of the second light-emitting unit 15 are electrically disconnected from the layers of the fourth light-emitting unit 25 by the inverse tapered steps of the insulating portions 6 and 62.

Subsequently, the fourth insulating portion 65 is formed. In order to prevent an end of the second electrode 14 near the second light-emitting device 20 from being electrically connected to the third electrode 16, the fourth insulating portion 65 is formed to fill a gap of the second insulating portion 62. The fourth insulating portion 65 can be formed of an insulating material by a method (e.g., dispenser coating and inkjet coating) of selectively forming the fourth insulating portion 65 to fill the gap.

Subsequently, the third electrode 16 and the fifth electrode 26 as a common electrode are formed in the same step. The common electrode is formed so as not to be divided by the inverse tapered step of the insulating portions 61 and 62. The fourth insulating portion 65 formed in advance prevents electrical connection between the second electrode 14 and the common electrode.

A vacuum deposition method, sputtering method and the like may be employed for forming the electrodes. A film forming method including dry film-forming such as vacuum deposition, sputtering, plasma or ion plating and wet film-forming such as spin coating, dipping, flow coating or ink-jet are applicable for forming the light-emitting unit.

Advantages of First Exemplary Embodiment

According to the first exemplary embodiment, the following advantages can be obtained.

In the light-emitting apparatus 1, a full color display is achieved using the color converter 80 by outputting the lights from the first light-emitting device 10 and the second light-emitting device 20 having tandem light-emitting units as the respective first and second color lights.

In the light-emitting apparatus 1, the second drive transistor 51B for the second light-emitting device 20 is electrically connected to the fourth electrode 24 provided between the third light-emitting unit 23 and the fourth light-emitting unit 25.

Accordingly, the light-emitting apparatus 1 can be driven without emission of a first color light-emitting layer of the third light-emitting unit 23, so that power consumption can be reduced. In the first exemplary embodiment, since the first color light-emitting layer of the light-emitting apparatus 1 is a blue fluorescent emitting layer, power consumption reduction effect of the light-emitting apparatus 1 can be enhanced as compared to an instance where the blue fluorescent emitting layer of the third light-emitting unit 23 emits light.

Moreover, in the light-emitting apparatus 1, since the insulating portions 61 and 62 insulate the second electrode 14 from the fourth electrode 24, short circuit or leakage between both of the electrodes can be reliably prevented, so that emission of the light-emitting devices 10 and 20 is precisely controllable.

In the light-emitting apparatus 1, the step is formed by the raised insulating portions 61 and 62 between the first light-emitting device 10 and the second light-emitting device 20. Accordingly, even when the second electrode 14 and the fourth electrode 24 are formed in the same step, the second electrode 14 and the fourth electrode 24 are not continuous to each other over the first light-emitting device 10 and the second light-emitting device 20. Accordingly, the second electrode 14 and the fourth electrode 24 can be electrically disconnected to reliably prevent short circuit or leakage between both of the electrodes, so that emission of the light-emitting devices 10 and 20 is precisely controllable.

Further, in the light-emitting apparatus 1, the insulating portions 61 and 62 each have the protrusion 63 that protrudes toward the first region and the second region. The protrusion 63 functions as a shadow mask for electrically disconnecting the second electrode 14 and the fourth electrode 24, so that both of the electrodes can be more reliably electrically disconnected. Consequently, short circuit between both of the electrodes can be more reliably prevented, so that emission of the light-emitting devices 10 and 20 is precisely controllable.

Moreover, in the light-emitting apparatus 1, since the auxiliary connector 221 is provided on the relay electrode 22 although the edge 22E of the relay electrode 22 is covered with the third insulating portion 64, electrical connection between the fourth electrode 24 and the drive drain electrode 513 can be reliably secured.

Second Exemplary Embodiment

Next, a second exemplary embodiment of the invention will be described with reference to the drawings.

Light-Emitting Apparatus

Figure 13:
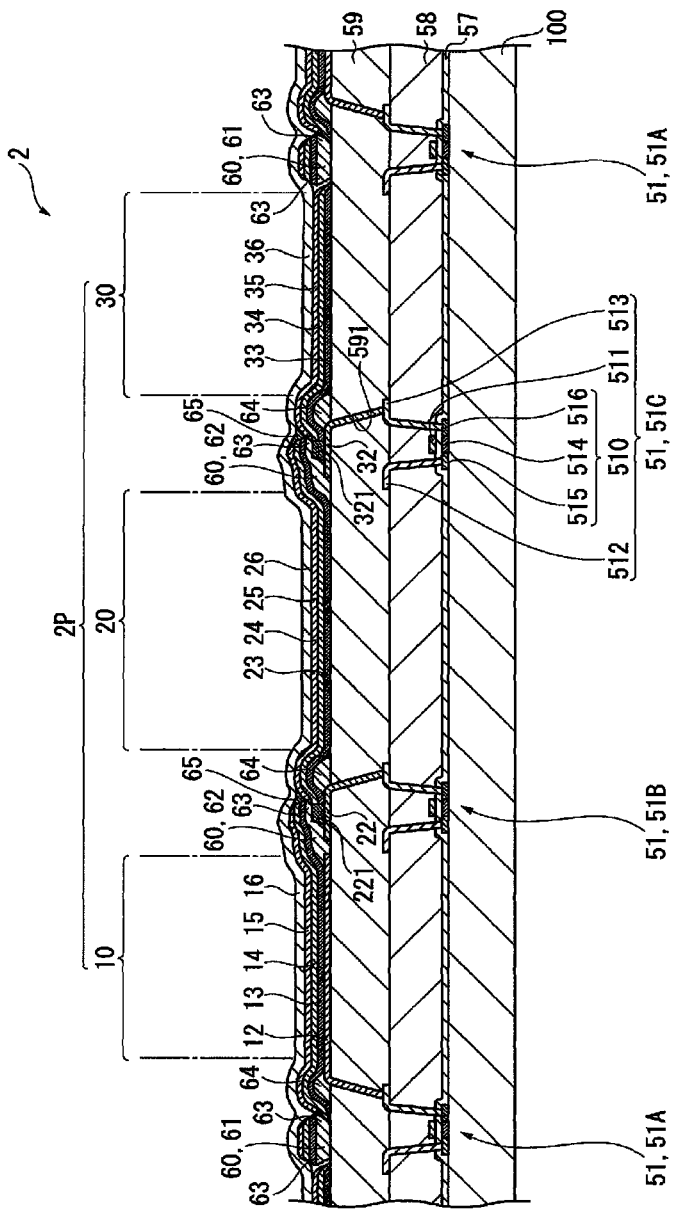
FIG. 13 is a schematic cross-sectional view in a substrate thickness direction showing a light-emitting apparatus according to a second exemplary embodiment.

FIG. 13 is a schematic cross-sectional view in a substrate thickness direction showing a light-emitting apparatus 2 according to the second exemplary embodiment.

In the description of the second exemplary embodiment, the same components as those in the first exemplary embodiment are denoted by the same reference signs and names to simplify or omit an explanation of the components. In the second exemplary embodiment, the same materials and compounds as described in the first exemplary embodiment are usable.

The light-emitting apparatus 2 includes the substrate 100, the first light-emitting device 10, the second light-emitting device 20 and a third light-emitting device 30. The light-emitting devices 10, 20 and 30 are driven by the device driving circuit 50.

In the light-emitting apparatus 2, a pixel 2P (a display unit) is defined including the first light-emitting device 10, second light-emitting device 20 and third light-emitting device 30. The light-emitting apparatus 2 includes a plurality of pixels 2P. The plurality of pixels 2P are arranged in a matrix as a whole to form a light-emitting region.

The third light-emitting device 30 is provided on a third region of the substrate 100 where the third light-emitting device is provided. The third region is provided between the first region where the first light-emitting device 10 is provided and the second region where the second light-emitting device 20 is provided. As shown in FIG. 13, the third light-emitting device 30 includes the fifth light-emitting unit 33, sixth electrode 34, sixth light-emitting unit 35 and seventh electrode 36. In the second exemplary embodiment, the fifth light-emitting unit 33, sixth electrode 34, sixth light-emitting unit 35 and seventh electrode 36 are provided in this order from the substrate 100. The third light-emitting device 30 also has a tandem device structure in the same manner as in the first exemplary embodiment. The same material as in the first exemplary embodiment is usable as a material for forming the third light-emitting device 30.

In the second exemplary embodiment, the second light-emitting unit 15, fourth light-emitting unit 25, and sixth light-emitting unit 35 are formed of the same material in the same step. The light-emitting units 15, 25 and 35 each include a second color light-emitting layer that emits a second color light and a third color light-emitting layer that emits a third color light.

The first light-emitting unit 13, third light-emitting unit 23 and fifth light-emitting unit 33 are formed of the same material in the same step. The light-emitting units 13, 23 and 33 each include a first color light-emitting layer that emits a first color light.

In the second exemplary embodiment, the first color light-emitting layer is a fluorescent emitting layer that emits the first color (blue) light. The second color light-emitting layer is a phosphorescent emitting layer that emits the second color (red) light. The third color light-emitting layer is a phosphorescent emitting layer that emits the third color (green) light.

In the second exemplary embodiment, the seventh electrode 36 is a common electrode formed of the same material as the third electrode 16 of the first light-emitting device 10 and the fifth electrode 26 of the second light-emitting device 20 in the same step substantially over the whole light-emitting region of the light-emitting apparatus 2.

The light-emitting apparatus 2 includes the same device driving circuit 50 as in the first exemplary embodiment, in which a third drive transistor 51C for driving the third light-emitting device 30, the switching transistor 52 and the capacitor device 53 are provided in every third light-emitting device 30.

Even in the third light-emitting device 30, a relay electrode 32 and an auxiliary connector 321 for electrically connecting the sixth electrode 34 to the drive drain electrode 513 of the third drive transistor 51C are formed between the second region and the third region on the flattening film 59 in the same manner as in the second light-emitting device 20. The relay electrode 32 is connected to the drive drain electrode 513 through the connection hole 591 of the flattening film 59. The relay electrode 32 and the auxiliary connector 321 can be formed of the same material by the same method as the relay electrode 22 and the auxiliary connector 221 of the second light-emitting device 20 as described in the first exemplary embodiment.

In the light-emitting apparatus 2, the insulating portion 62 is also formed between the second light-emitting device 20 and the third light-emitting device 30. Since the insulating portion 62 is shaped in an inverse tapered step, the electrodes and the light-emitting units in adjacent devices are electrically disconnected as described in the first exemplary embodiment. An end of the sixth electrode 34 reaches the base of the inverse tapered insulating portion 62 formed between the light-emitting devices 20 and 30 to be connected to a side surface of the auxiliary connector 321, so that the sixth electrode 34 and the drive drain electrode 513 are electrically connected.

Figure 14:
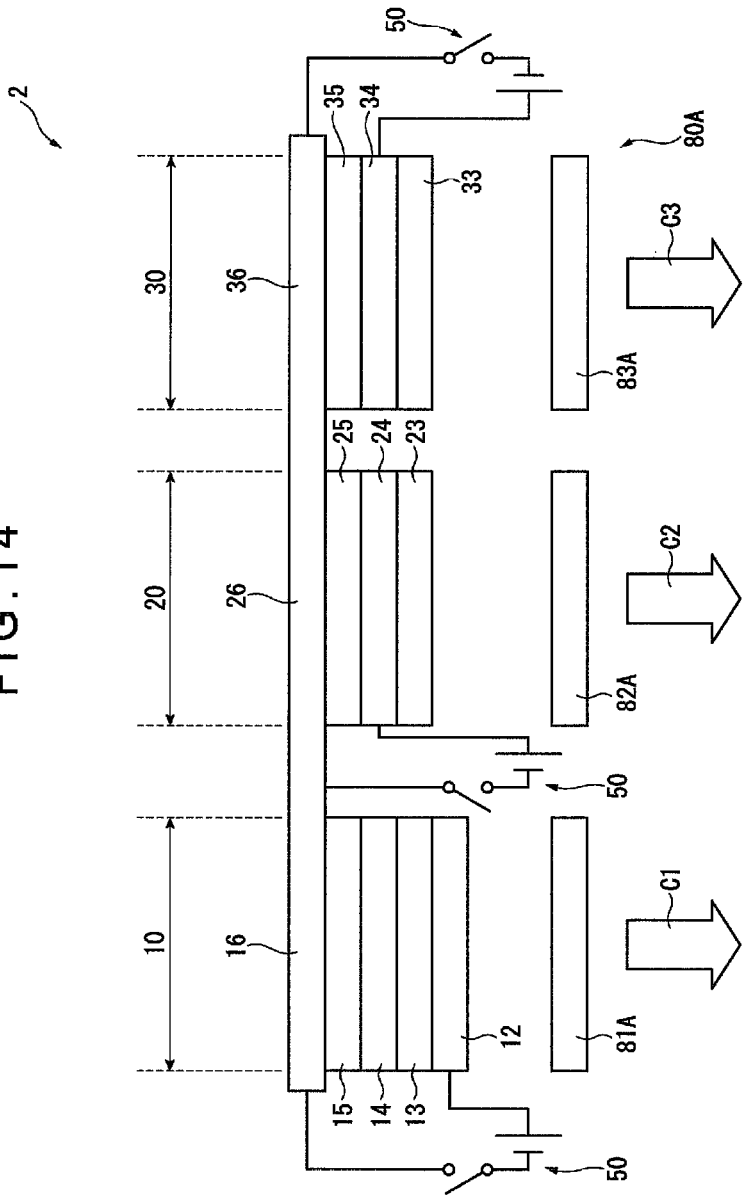
FIG. 14 is a schematic view showing a laminated arrangement of a light-emitting device of the light-emitting apparatus according to the second exemplary embodiment.

FIG. 14 is a schematic view showing a laminated arrangement of the light-emitting devices 10, 20 and 30 in the light-emitting apparatus 2.

As shown in FIG. 14, a color converter 80A is provided to an opposite surface of the substrate 100 from a surface where the light-emitting devices 10, 20, 30 and the like are provided.

The color converter 80A includes: a first color conversion portion 81A that transmits the first color light C1 and blocks the second color light C2 and the third color light C3; a second color conversion portion 82A that transmits the second color light C2 and blocks the third color light C3; and a third color conversion portion 83A that transmits the third color light C3 and blocks the second color light C2. As shown in FIG. 14, by providing the color converter 80A, the first color light C1 (blue) can be displayed on a portion of the color converter 80A corresponding to the first light-emitting device 10; the second color light C2 (red) can be displayed on a portion of the color converter 80A corresponding to the second light-emitting device 20; and the third color light C3 (green) can be displayed on a portion of the color converter 80A corresponding to the third light-emitting device 30. In short, a full color display in RGB becomes possible.

Advantages of Second Exemplary Embodiment

According to the second exemplary embodiment, the following advantages can be obtained in addition to the advantages of the first exemplary embodiment.

In the light-emitting apparatus 2, the light-emitting devices 10, 20 and 30 are provided on the substrate 100. The second drive transistor 51B of the second light-emitting device 20 is electrically connected to the fourth electrode 24 (relay electrode). The third drive transistor 51C of the third light-emitting device 30 is electrically connected to the sixth electrode 34 (relay electrode). Accordingly, with the light-emitting apparatus 2, the third light-emitting unit 23 of the second light-emitting device 20 and the fifth light-emitting unit 33 of the third light-emitting device 30 can be driven without emission of the respective first color light-emitting layers of the third light-emitting unit 23 and the fifth light-emitting unit 33. Although the light-emitting apparatus 2 includes the plurality of pixels 2P for displaying RGB colors from the corresponding portions of the light-emitting devices 10, 20 and 30, power consumption can be reduced.

Third Exemplary Embodiment

Next, a third exemplary embodiment of the invention will be described with reference to the drawings.

Light-Emitting Apparatus

Figure 15:
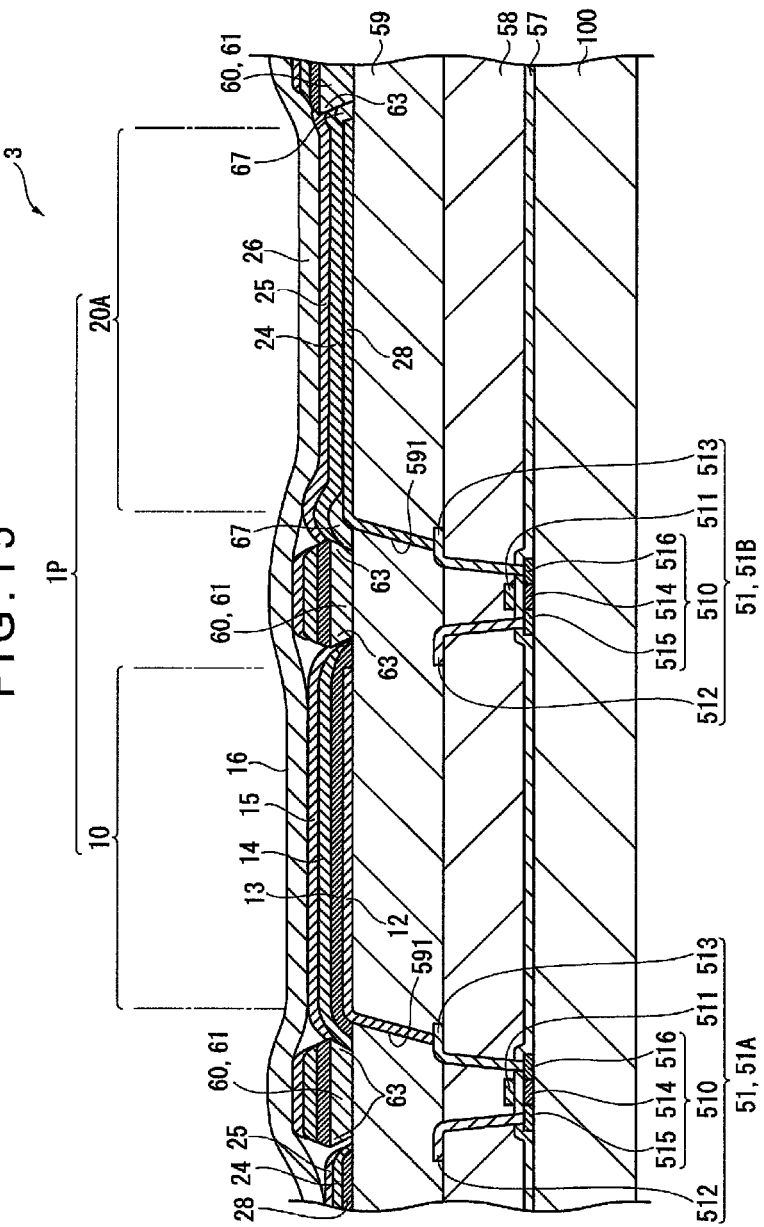
FIG. 15 is a schematic cross-sectional view in a substrate thickness direction showing a light-emitting apparatus according to a third exemplary embodiment.

FIG. 15 is a schematic cross-sectional view in a substrate thickness direction showing a light-emitting apparatus 3 according to the third exemplary embodiment.

In the description of the third exemplary embodiment, the same components as those in the above exemplary embodiments are denoted by the same reference signs and names to simplify or omit an explanation of the components. In the third exemplary embodiment, the same materials and compounds as described in the above exemplary embodiments are usable.

The light-emitting apparatus 3 is different from the light-emitting apparatus 1 in the arrangement of the second light-emitting device 20.

A second light-emitting device 20A of the light-emitting apparatus 3 is provided in the second region of the substrate 100 and adjacent to the first light-emitting device 10 provided in the first region. The second light-emitting device 20A includes an eighth electrode 28, the fourth electrode 24, the fourth light-emitting unit 25 and the fifth electrode 26. In the third exemplary embodiment, the eighth electrode 28, fourth electrode 24, fourth light-emitting unit 25 and fifth electrode 26 are provided in this order from the substrate 100.

Unlike in the first light-emitting device 10, the fourth electrode 24 is laminated on the eighth electrode 28 to be electrically connected in the second light-emitting device 20A. The second light-emitting device 20A as an organic EL device includes the eighth electrode 28, the fifth electrode 26, and the fourth light-emitting unit 25 interposed between the fifth electrode 26 and the eighth electrode 28. In the second light-emitting device 20A, the eighth electrode 28 corresponds to the anode while the fifth electrode 26 corresponds to the cathode.

As described above, the fifth electrode 26 is a common electrode with the third electrode 16 of the first light-emitting device 10 and is formed in the same procedure substantially over the whole light-emitting region of the light-emitting apparatus 1.

Light-Emitting Unit

In the third exemplary embodiment, the fourth light-emitting unit 25 forms a planar light-emitting region.

In the third exemplary embodiment, no third light-emitting unit 23 is provided unlike in the first exemplary embodiment. Accordingly, electrical charges are injected from the fourth electrode 24 connected to the eighth electrode 28 and the fifth electrode 26 into the fourth light-emitting unit 25. The injected electrical charges are recombined, whereby the fourth light-emitting unit 25 emits light. The third light-emitting unit 23 may be formed as a common light-emitting unit with the first light-emitting unit 13 in the second region when the first light-emitting unit 13 is formed. It is only required to subsequently remove the formed third light-emitting unit 23. The third light-emitting unit 23 is removed by laser irradiation and the like. Even when an organic layer of the third light-emitting unit remains in a part of the second region, as long as a partial electrical connection between the eighth electrode 28 and the fourth electrode 24 is secured, electrical charges are injected from the fourth electrode 24 into the fourth light-emitting unit 25, leading to a stable emission. A reference numeral 67 in FIG. 15 denotes a remaining film of the third light-emitting unit 23 after removal by laser irradiation and the like.

Connection between Light-Emitting Device and Device Driving Circuit

The first electrode 12 is formed substantially over the entire surface of the first region on which the first light-emitting device 10 is formed on the flattening film 59. The eighth electrode 28 is formed substantially over the entire surface of the second region on which the second light-emitting device 20A is formed on the flattening film 59.

Insulating Portion

The insulating portion 60 for partitioning and electrically insulating the first light-emitting device 10 from the second light-emitting device 20A is formed between the first light-emitting device 10 and the second light-emitting device 20A which are adjacent to each other on the flattening film 59. The insulating portion 60 is provided by the first insulating portion 61 described in the first exemplary embodiment.

The first insulating portion 61 is raised from the substrate 100, so that a step is formed between the first light-emitting device 10 and the second light-emitting device 20A. Further, the first insulating portion 61 has the protrusion 63 that protrudes toward the first region on which the first light-emitting device 10 is formed and the second region in which the second light-emitting device 20A is formed. The step formed by the first insulating portion 61 is in an inverse tapered shape as described above. The layers of the first light-emitting device 10 and the layers of the second light-emitting device 20A reach under the protrusion 63.

The layers of the first light-emitting device 10 are formed over the first region where the first light-emitting device 10 is formed while the layers of the second light-emitting device 20A are formed over the second region where the second light-emitting device 20A is formed, on the flattening film 59 where the first electrode 12, eighth electrode 28 and insulating portion 60 are formed. As described above, the second electrode 14 and the fourth electrode 24 are respectively formed of the same material in the same step over the first region and the second region. The second light-emitting unit 15 and the fourth light-emitting unit 25 are also respectively formed of the same material in the same step over the first region and the second region. However, the second electrode 14 is disconnected from the fourth electrode 24 by the inverse tapered step of the first insulating portion 61, so that the second light-emitting unit 15 is disconnected from the fourth light-emitting unit 25.

In the light-emitting apparatus 3, the eighth electrode 28 is also provided in the connection hole 591 and further electrically connected to a part of the drive drain electrode 513 on the upper surface of the interlayer insulating film 58.

The arrangements of the other components in the light-emitting apparatus 3 are the same as in the above exemplary embodiments.

Advantages of Third Exemplary Embodiment

The light-emitting apparatus 3 can be driven without an unnecessary emission of the light-emitting layer since having no third light-emitting unit 23 unlike in the light-emitting apparatus 1 of the first exemplary embodiment, so that power consumption can be reduced.

According to the third embodiment, the same advantages as in the first exemplary embodiment can be obtained.

Fourth Exemplary Embodiment

Next, a fourth exemplary embodiment of the invention will be described with reference to the drawings.

Light-Emitting Apparatus

Figure 16:
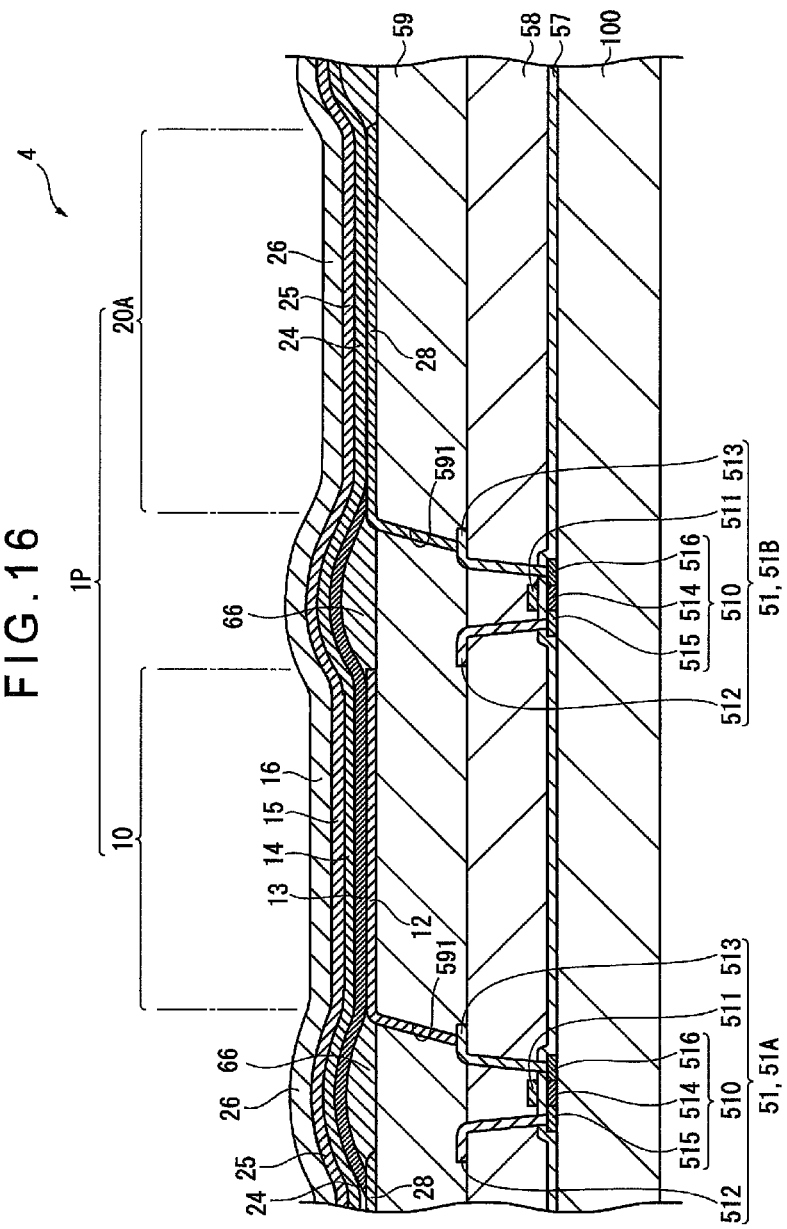
FIG. 16 is a schematic cross-sectional view in a substrate thickness direction showing a light-emitting apparatus according to a fourth exemplary embodiment.

FIG. 16 is a schematic cross-sectional view in a substrate thickness direction showing a light-emitting apparatus 4 according to the fourth exemplary embodiment.

In the description of the fourth exemplary embodiment, the same components as those in the above exemplary embodiments are denoted by the same reference signs and names to simplify or omit an explanation of the components. In the fourth exemplary embodiment, the same materials and compounds as described in the above exemplary embodiments are usable.

The light-emitting apparatus 4 is different from the light-emitting apparatus 3 in the arrangement of the insulating portion.

In the light-emitting apparatus 4, the insulating portion provided between the first light-emitting device 10 and the second light-emitting device 20A forming each pixel is a fifth insulating portion 66 that covers the respective edges of the first electrode 12 and the eighth electrode 28. The fifth insulating portion 66 is not in an inverse tapered shape unlike the first insulating portion 61 and the second insulating portion 62 in the above exemplary embodiments. Accordingly, in the light-emitting apparatus 4, the layers forming the first light-emitting device 10 and the second light-emitting device 20, 20A are not divided, so that the second electrode 14 is continuous to the fourth electrode 24 while the second light-emitting unit 15 is continuous to the fourth light-emitting unit 25. It should be noted that the first light-emitting unit 13 is provided in the first region where the first light-emitting device 10 is formed, but is not provided in the second region where the second light-emitting device 20A is formed.

The arrangements of the other components in the light-emitting apparatus 4 are the same as in the above exemplary embodiments.

Advantages of Fourth Exemplary Embodiment

In the light-emitting apparatus 4, when the electric conductivity of the second electrode 14 and the fourth electrode 24 (which correspond to the intermediate layer) is in a range of $10^{-10}$ S/cm to $10^{-2}$ S/cm, leakage of electric current to an adjacent pixel does not occur. Accordingly, emission of each pixel is independently controllable without dividing the respective intermediate layers of the light-emitting devices by forming the step with the inverse tapered second insulating portion 62 and the like as in the first exemplary embodiment.

Fifth Exemplary Embodiment

Next, a fifth exemplary embodiment of the invention will be described with reference to the drawings.

Light-Emitting Apparatus

Figure 17:
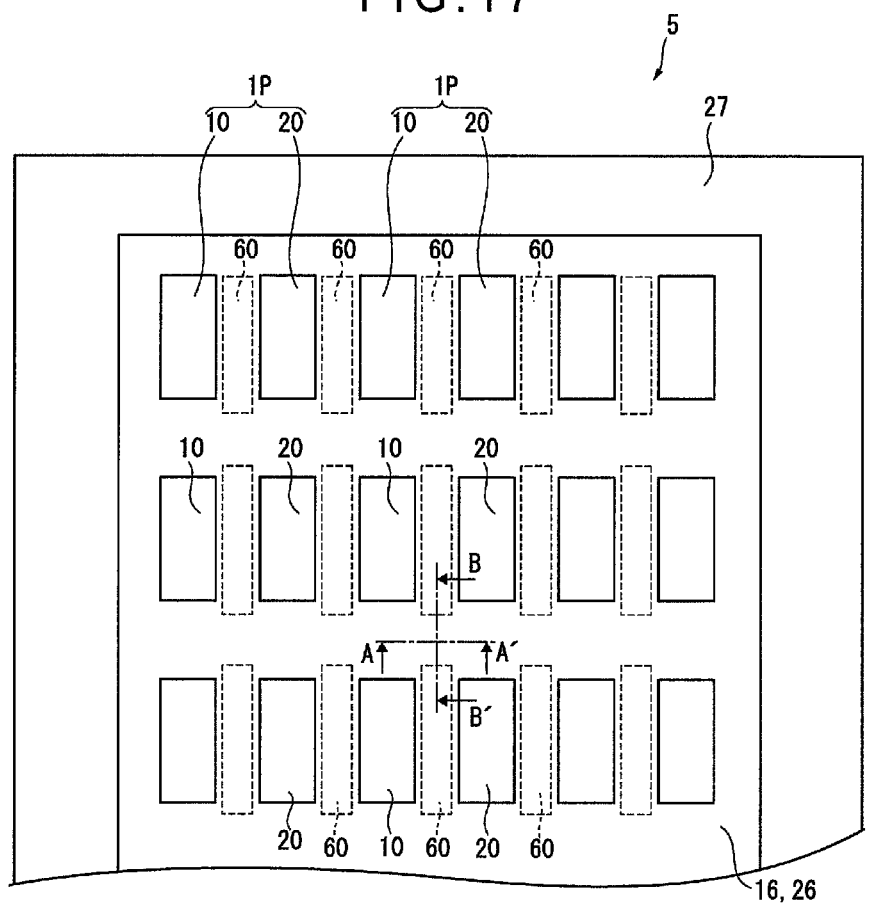
FIG. 17 is a plan view showing a light-emitting apparatus according to a fifth exemplary embodiment.

FIG. 17 is a plan view showing a light-emitting apparatus 5 according to the fifth exemplary embodiment.

In the description of the fifth exemplary embodiment, the same components as those in the above exemplary embodiments are denoted by the same reference signs and names to simplify or omit an explanation of the components. In the fifth exemplary embodiment, the same materials and compounds as described in the above exemplary embodiments are usable.

The light-emitting apparatus 5 is different from the light-emitting apparatus 1 in a shape of the insulating portion. While the insulating portion 60 is continuously provided in the longitudinal direction as shown in FIG. 1, the insulating portion 60 is spaced from each other at every predetermined distance in the longitudinal direction between the first light-emitting device 10 and the second light-emitting device 20 in the light-emitting apparatus 5 as shown in FIG. 17.

Figure 18:
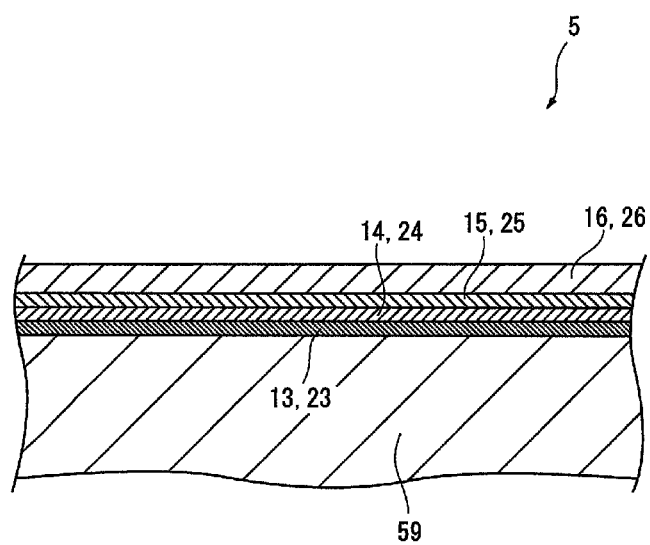
FIG. 18 is a schematic cross-sectional view in a substrate thickness direction showing the light-emitting apparatus according to the fifth exemplary embodiment.

FIG. 18 is a schematic cross-sectional view in the substrate thickness direction showing the light-emitting apparatus 5 and shows a cross sectional view taken along A-A' line of FIG. 17 in a direction of arrows. As shown in FIG. 18, in the portion shown in the cross sectional view of FIG. 17, no insulating portion 60 is provided between the region where the first light-emitting device 10 is provided and the region where the second light-emitting device 20 is provided.

Accordingly, the layers of the first light-emitting device 10 are not disconnected from the layers of the second light-emitting device 20.

Figure 19:
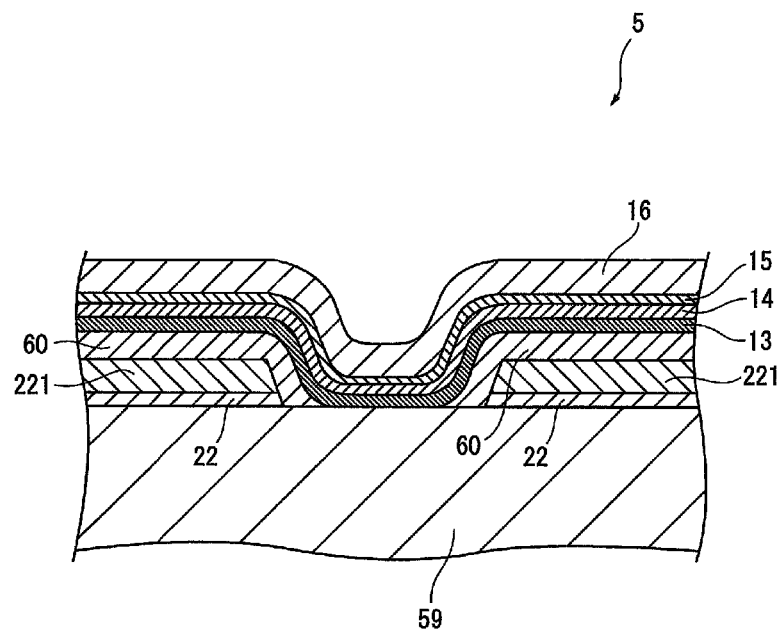
FIG. 19 is another schematic cross-sectional view in the substrate thickness direction showing the light-emitting apparatus according to the fifth exemplary embodiment.

FIG. 19 is a schematic cross-sectional view in the substrate thickness direction showing the light-emitting apparatus 5 and shows a cross sectional view taken along B-B' line of FIG. 17 in a direction of arrows. As shown in FIG. 19, the insulating portion 60 is not continuous between the first light-emitting devices 10.

In the light-emitting apparatus 5, the insulating portion 60 is thus provided in the region where the first light-emitting device 10 is adjacent to the second light-emitting device 20 whereas no insulating portion 60 is provided in other regions. With this arrangement, the inverse tapered first insulating portion 61 and the step of the second insulating portion 62 are not formed in the region where no insulating portion 60 is formed. As a result, the third electrode 16 and the fifth electrode 26 in a form of the above-described common electrode are unlikely to be divided, so that electrical connection is likely to occur over the entire light-emitting region in the light-emitting apparatus 5.

In the light-emitting apparatus 5, the leading electrode 27 is provided at ends of the third electrode 16 and the fifth electrode 26 in the longitudinal and traverse directions of the light-emitting apparatus 5 to be connected to the third electrode 16 and the fifth electrode 26. The leading electrode 27 is provided in the longitudinal and traverse directions as shown in FIG. 17. Since the insulating portion 60 is provided at every predetermined distance in the longitudinal direction of the light-emitting apparatus 5, electrical connection is also likely to occur over the entire light-emitting region using the leading electrode 27 provided at the traverse ends of the light-emitting apparatus 5.

The arrangements of the other components in the light-emitting apparatus 5 are the same as in the above exemplary embodiments.

According to the fifth exemplary embodiment, the same advantages as in the first exemplary embodiment can be obtained.

Modifications of Embodiment(s)

The scope of the invention is not limited to the above-described exemplary embodiments but also includes modification(s) and improvement(s) as long as an object of the invention can be achieved.

In the above exemplary embodiments, the arrangement of the invention in which the auxiliary connector is formed on the relay electrode and connected to the fourth electrode (intermediate electrode) is described as an example. However, the arrangement of the invention is not limited thereto. Specifically, the auxiliary connector is not requisite. It is only required to secure connection between the fourth electrode and the relay electrode, thereby securing electrical connection between the second drive transistor and the fourth electrode.

A pixel electrode may be formed on a side of the third light-emitting unit near the substrate in the second light-emitting device in the same step as formation of the first electrode. In other words, the third light-emitting unit may be held between the fourth electrode (intermediate electrode) and the pixel electrode. However, even in this arrangement, the pixel electrode and the second drive transistor are not electrically connected, but the fourth electrode and the second drive transistor are electrically connected.

The arrangement of the invention is not limited to the arrangement described in the above exemplary embodiments, but one of the flattening film and the interlayer insulating film may be omitted.

In the first exemplary embodiment, the arrangement of the invention in which the second light-emitting unit and the fourth light-emitting unit have the respective light-emitting layers that emit the second color light (yellow) is described as an example. However, each of the second light-emitting unit and the fourth light-emitting unit may have the light-emitting layer that emits red light and the light-emitting layer that emits green light. In this arrangement, mixed red and green light may be regarded as the second color light. In this arrangement, the color conversion portions in a form of three color filters in RGB colors are respectively provided to the first light-emitting device and the two second light-emitting devices, so that three colors in RGB can be obtained.

In the above exemplary embodiments, the arrangement of the invention in which the first light-emitting device, the second light-emitting device and the like are formed on the substrate is described as an example. However, the arrangement of the invention is not limited thereto. For instance, after the first light-emitting device and the second light-emitting device are formed on the substrate, the first light-emitting device and the second light-emitting device may be peeled and repositioned on another support. The support is exemplified by a flexible substrate.

In the above exemplary embodiments, the arrangement of the invention in which the first light-emitting unit emits light in mixed color of the first color light and the second color light is described as an example. However, the arrangement of the invention is not limited thereto. For instance, the first light-emitting unit may emit the first color light in the first light-emitting device while the second light-emitting unit may emit the second color light in the second light-emitting device. Thus, in the first light-emitting device and the second light-emitting device respectively having the light-emitting layers capable of emitting the first color light and the second color light, the respective light-emitting layers to emit light in the first light-emitting device and the second light-emitting device can be selected, so that power consumption can be further reduced.

The invention claimed is:

1. A light-emitting apparatus comprising:
a first light-emitting device that comprises a first light-emitting unit, a second light-emitting unit, and a first intermediate layer interposed between the first light-emitting unit and the second light-emitting unit, the first light-emitting unit, the second light-emitting unit and the first intermediate layer being laminated to each other;
a second light-emitting device that comprises a third light-emitting unit that is formed in the same step as the first light-emitting unit, a fourth light-emitting unit that is formed in the same step as the second light-emitting unit, and a second intermediate layer that is formed in the same step as the first intermediate layer, the third light-emitting unit, the fourth light-emitting unit and the second intermediate layer being laminated to each other; and
a device driving portion that comprises a first drive transistor for driving the first light-emitting device and a second drive transistor for driving the second light-emitting device, wherein
the first light-emitting unit and the third light-emitting unit each have a first color light-emitting layer that emits a first color light, the second light-emitting unit and the fourth light-emitting unit each have a second color light-emitting layer that emits a second color light, the first drive transistor drives the first light-emitting unit to make the first light-emitting device emit the first color light or drives the second light-emitting unit to make the first light-emitting device emit the second color light, and the second drive transistor drives the third light-emitting unit or the fourth light-emitting unit to make the second light-emitting device emit a color light different from the color light emitted from the first light-emitting device.

2. The light-emitting apparatus according to claim 1, wherein the first color light-emitting layer of each of the first light-emitting unit and the third light-emitting unit is a blue fluorescent emitting layer.

3. The light-emitting apparatus according to claim 1, further comprising:

a color conversion portion that is provided on a side of the first light-emitting device from which light is extracted and that transmits the first color light and blocks the second color light.

4. Electronic equipment comprising: the light-emitting apparatus according to claim 1.

5. A light-emitting apparatus comprising:

a first light-emitting device that comprises a first light-emitting unit, a second light-emitting unit, and a first intermediate layer interposed between the first light-emitting unit and the second light-emitting unit, the first light-emitting unit, the second light-emitting unit and the first intermediate layer being laminated to each other;

a second light-emitting device that comprises a third light-emitting unit that is formed in the same step as the first light-emitting unit, a fourth light-emitting unit that is formed in the same step as the second light-emitting unit, and a second intermediate layer that is formed to have the same arrangement as the first intermediate layer, the third light-emitting unit, the fourth light-emitting unit and the second intermediate layer being laminated to each other; and a device driving portion that comprises a first drive transistor for driving the first light-emitting device and a second drive transistor for driving the second light-emitting device, wherein the first light-emitting unit and the third light-emitting unit each have a first color light-emitting layer that emits a first color light, the second light-emitting unit and the fourth light-emitting unit each have a second color light-emitting layer that emits a second color light, the first drive transistor drives the first light-emitting unit and the second light-emitting unit to make the first light-emitting device emit the first color light and the second color light, and the second drive transistor drives the third light-emitting unit to make the second light-emitting device emit the first color light or drives the fourth light-emitting unit to make the second light-emitting device emit the second color light.

6. A light-emitting apparatus comprising:

a first light-emitting device that comprises a first light-emitting unit, a second light-emitting unit, and a first intermediate layer interposed between the first light-emitting unit and the second light-emitting unit, the first light-emitting unit, the second light-emitting unit and the first intermediate layer being laminated to each other;

a second light-emitting device that comprises a third light-emitting unit that is formed to have the same arrangement as the first light-emitting unit, a fourth light-emitting unit that is formed to have the same arrangement as the second light-emitting unit, and a second intermediate layer that is interposed between the third light-emitting unit and the fourth light-emitting unit and is formed to have the same arrangement as the first intermediate layer, the third light-emitting unit, the fourth light-emitting unit and the second intermediate layer being laminated to each other; and a device driving portion that comprises a first drive transistor for driving the first light-emitting device and a second drive transistor for driving the second light-emitting device, wherein the first light-emitting unit and the third light-emitting unit each have a first color light-emitting layer that emits a first color light, the second light-emitting unit and the fourth light-emitting unit each have a second color light-emitting layer that emits a second color light, the first drive transistor drives the first light-emitting unit to make the first light-emitting device emit the first color light or drives the second light-emitting unit to make the first light-emitting device emit the second color light, and the second drive transistor drives the third light-emitting unit or the fourth light-emitting unit to make the second light-emitting device emit a color light different from the color light emitted from the first light-emitting device.

7. A light-emitting apparatus comprising:

a first light-emitting device that comprises a first light-emitting unit, a second light-emitting unit, and a first intermediate layer interposed between the first light-emitting unit and the second light-emitting unit, the first light-emitting unit, the second light-emitting unit and the first intermediate layer being laminated to each other;

a second light-emitting device that comprises a third light-emitting unit that is formed to have the same arrangement as the first light-emitting unit, a fourth light-emitting unit that is formed to have the same arrangement as the second light-emitting unit, and a second intermediate layer that is interposed between the third light-emitting unit and the fourth light-emitting unit and is formed to have the same arrangement as the first intermediate layer, the third light-emitting unit, the fourth light-emitting unit and the second intermediate layer being laminated to each other; and a device driving portion that comprises a first drive transistor for driving the first light-emitting device and a second drive transistor for driving the second light-emitting device, wherein the first light-emitting unit and the third light-emitting unit each have a first color light-emitting layer that emits a first color light, the second light-emitting unit and the fourth light-emitting unit each have a second color light-emitting layer that emits a second color light, the first drive transistor drives the first light-emitting unit and the second light-emitting unit to make the first light-emitting device emit the first color light and the second color light, and the second drive transistor drives the third light-emitting unit to make the second light-emitting device emit the first color light or drives the fourth light-emitting unit to make the second light-emitting device emit the second color light.

8. A light-emitting apparatus comprising:
a first light-emitting device;
a second light-emitting device; and
a device driving portion that comprises a first drive transistor for driving the first light-emitting device and a second drive transistor for driving the second light-emitting device, wherein
the first light-emitting device comprises a first electrode, a first light-emitting unit, a second electrode, a second light-emitting unit, and a third electrode in this order,
the second light-emitting device comprises an eighth electrode, a fourth electrode, a fourth light-emitting unit, and a fifth electrode in this order,
the second electrode and the fourth electrode are formed in the same step,
the first light-emitting unit has a first color light-emitting layer that emits a first color light,
the second light-emitting unit and the fourth light-emitting unit are formed in the same step and each have a second color light-emitting layer that emits a second color light,
the first drive transistor is electrically connected to the first electrode, and
the second drive transistor is electrically connected to the eighth electrode.

9. A light-emitting apparatus comprising:
a first light-emitting device;
a second light-emitting device;
a third light-emitting device; and
a device driving portion that comprises a first drive transistor for driving the first light-emitting device, a second drive transistor for driving the second light-emitting device, and a third drive transistor for driving the third light-emitting device, wherein
the first light-emitting device comprises a first electrode, a first light-emitting unit, a second electrode, a second light-emitting unit, and a third electrode in this order,
the second light-emitting device comprises a third light-emitting unit, a fourth electrode, a fourth light-emitting unit, and a fifth electrode in this order,
the third light-emitting device comprises a fifth light-emitting unit, a sixth electrode, a sixth light-emitting unit, and a seventh electrode in this order,
the first light-emitting unit, the third light-emitting unit and the fifth light-emitting unit are formed in the same step and each have a first color light-emitting layer that emits a first color light,
the second electrode, the fourth electrode and the seventh electrode are formed in the same step,
the second light-emitting unit, the fourth light-emitting unit and the sixth light-emitting unit are formed in the same step and each have a second color light-emitting layer that emits a second color light,
the first drive transistor is electrically connected to the first electrode,
the second drive transistor is electrically connected to the fourth electrode, and
the third drive transistor is electrically connected to the sixth electrode.

10. A light-emitting apparatus comprising:
a first light-emitting device;
a second light-emitting device; and
a device driving portion that comprises a first drive transistor for driving the first light-emitting device and a second drive transistor for driving the second light-emitting device, wherein
the first light-emitting device and the second light-emitting device each have an intermediate electrode,
the intermediate electrode is electrically divided by an insulating portion between the first light-emitting device and the second light-emitting device into a second electrode and a fourth electrode,
the first light-emitting device comprises a first electrode, a first light-emitting unit, a second electrode, a second light-emitting unit, and a third electrode in this order,
the second light-emitting device comprises a third light-emitting unit, a fourth electrode, a fourth light-emitting unit, and a fifth electrode in this order,
the first light-emitting unit and the third light-emitting unit each have a first color light-emitting layer that emits a first color light,
the second light-emitting unit and the fourth light-emitting unit each have a second color light-emitting layer that emits a second color light,
the first drive transistor is electrically connected to the second electrode, and
the second drive transistor is electrically connected to the fourth electrode.

11. A light-emitting apparatus comprising:
a first light-emitting device;
a second light-emitting device; and
a device driving portion that comprises a first drive transistor for driving the first light-emitting device and a second drive transistor for driving the second light-emitting device, wherein
the first light-emitting device comprises: a first electrode, a first light-emitting unit, a second electrode, a second light-emitting unit, and a third electrode in this order,
the second light-emitting device comprises: a third light-emitting unit, a fourth electrode, a fourth light-emitting unit, and a fifth electrode in this order,
the first light-emitting unit and the third light-emitting unit are formed in the same step and each have a first color light-emitting layer that emits a first color light,
the second electrode and the fourth electrode are formed in the same step,
the second light-emitting unit and the fourth light-emitting unit are formed in the same step and each have a second color light-emitting layer that emits a second color light,
the first drive transistor is electrically connected to the first electrode, and
the second drive transistor is electrically connected to the fourth electrode to avoid a potential difference between ends in a thickness direction of the third light-emitting unit.

12. A method of manufacturing a light-emitting apparatus comprising a substrate, a first light-emitting device provided on the substrate, a second light-emitting device provided in a region of the substrate different from a region of the substrate where the first light-emitting device is provided, the method comprising:
forming on the substrate a first drive transistor for driving the first light-emitting device and a second drive transistor for driving the second light-emitting device;
forming a first electrode in a first region of the substrate where the first light-emitting device is formed to electrically connect the first electrode to the first drive transistor;

forming an insulating portion, which is raised from the substrate and having a protrusion that protrudes toward a second region where the second light-emitting device is formed, at a position for dividing the first region and the second region;

forming a first color light-emitting unit comprising a first color light-emitting layer that emits a first color light, across the insulating portion over the first and second regions;

forming an intermediate electrode across the insulating portion over the first region and the second region to electrically connect the intermediate electrode in the second region to the second drive transistor; and forming a second color light-emitting unit comprising a second color light-emitting layer that emits a second color light, across the insulating portion over the first and second regions.

13. A light-emitting apparatus comprising:
a first light-emitting device;
a second light-emitting device; and
a device driving portion that comprises a first drive transistor for driving the first light-emitting device and a second drive transistor for driving the second light-emitting device, wherein
the first light-emitting device comprises a first electrode, a first light-emitting unit, a second electrode, a second light-emitting unit, and a third electrode in this order,
the second light-emitting device comprises a third light-emitting unit, a fourth electrode, a fourth light-emitting unit, and a fifth electrode in this order,
the first light-emitting unit and the third light-emitting unit are formed in the same step and each have a first color light-emitting layer that emits a first color light,
the second electrode and the fourth electrode are formed in the same step,
the second light-emitting unit and the fourth light-emitting unit are formed in the same step and each have a second color light-emitting layer that emits a second color light,
the first drive transistor is electrically connected to the first electrode, and
the second drive transistor is electrically connected to the fourth electrode.

14. The light-emitting apparatus according to claim 13, further comprising:
an insulating portion that electrically insulates the second electrode from the fourth electrode.

15. The light-emitting apparatus according to claim 14, wherein
the insulating portion is raised from the first electrode toward the third electrode, and
an end of the second electrode near the second light-emitting device overlaps on the raised insulating portion to electrically disconnect the second electrode from the fourth electrode.

16. The light-emitting apparatus according to claim 15, wherein
the insulating portion has a protrusion that protrudes toward the second light-emitting device.

\* \* \* \* \*